United States Patent [19]

Ogushi et al.

[11] Patent Number: 4,892,862
[45] Date of Patent: Jan. 9, 1990

[54] PROCESS FOR PRODUCING SUPERCONDUCTING MATERIAL

[75] Inventors: Tetsuya Ogushi; Yoshinori Hakuraku, both of Kagoshima; Hisanao Ogata, Ibaraki, all of Japan

[73] Assignee: Hitachi, Ltd., Tokyo, Japan

[21] Appl. No.: 181,097

[22] Filed: Apr. 13, 1988

[30] Foreign Application Priority Data

| Apr. 13, 1987 | [JP] | Japan | 62-88847 |
| May 18, 1987 | [JP] | Japan | 62-118844 |
| May 18, 1987 | [JP] | Japan | 62-118846 |
| Aug. 21, 1987 | [JP] | Japan | 62-206359 |
| Aug. 21, 1987 | [JP] | Japan | 62-206360 |

[51] Int. Cl.$^4$ ............... H01L 39/24; C23C 14/34
[52] U.S. Cl. .................. 505/1; 204/192.24; 427/62; 427/383.9; 505/725; 505/730; 505/731
[58] Field of Search .............. 204/192.24; 427/62, 427/383.9; 505/1, 816, 818, 819, 821; 29/599

[56] References Cited

U.S. PATENT DOCUMENTS

| 4,367,102 | 1/1983 | Wilhelm | 148/133 |
| 4,826,808 | 5/1989 | Yurek et al. | 505/1 |

FOREIGN PATENT DOCUMENTS

| 0280812 | 9/1988 | European Pat. Off. | 505/1 |
| 56-109824 | 8/1981 | Japan | 204/192.24 |
| WO88/05029 | 7/1988 | World Int. Prop. O. | 505/1 |

OTHER PUBLICATIONS

D. M. Gruen et al, *J. Electrochem. Soc.*, vol. 134, No. 6, pp. 1588–1589 (Jun. 1987).
Z. Bao et al, *Int'l J. Modern Phys. B*, vol. 1, No. 2, pp. 535–539 (1987).
C. Chang et al., *Appl. Phys Lett.*, vol. 52, No. 1, pp. 72–74 (Jan. 1988).
Y. Sorimachi et al, *Japanese J. Appl. Phys.*, vol. 26, No. 9, pp. L1451–L1452 (Sep. 1987).
H. Kumakura et al, *Japanese J. Appl. Phys.*, vol. 26, No. 7, pp. L1172–L1173 (Jul. 1987).
H. Shimizu et al, *Jap. J. Appl. Phys*, vol. 27, No. 3, Mar. 1988, pp. L414–L416.
Japanese Journal of Applied Physics, vol. 26, No. 4, part 2, Apr. 1987, pp. L337–L338, Tokyo, JP T. Hasegawa et al, "High Tc Superconductivity of La-1-xSrx)2CuO4—Effect of Substitution of Foreing Ions for Cu and La ... ".
Proceedings of the 18th International Conference on Low Temperature Physics, Japanese Journal of Applied Physics, Kyoto, 20th–26th, Aug. 1987, pp. 1141–1142, "Sputter Deposited Films of Perovskite Compound and Nb-Si-O ... ".
Physical Review Letters, vol. 58, No. 24, 15th Jun. 1987, pp. 2579–2581, The American Physical Society, New York, US; S. R. Ovshinsky et al, "Superconductivity at 155K".

*Primary Examiner*—Aaron Weisstuch
*Attorney, Agent, or Firm*—Antonelli, Terry & Wands

[57] ABSTRACT

Oxide materials having the formulae $(L_xA_{1-x})_iMO_y$, $(L_xA_{1-x})_i\text{-}M_{1-z}Cu_zO_y$ and $(L_xA_{1-x})_iMO_{j-\delta}G_k$, wherein L is Sc, Y, lanthanides, etc.; A is Ba, Sr, Ca, etc.; M is V, Nb, Ta, Ti, Zr or Hf; $0<x<1$; $0<z<1$; $i=1$, 3/2 or 2; $0<y\leq 4$; G is F, Cl or N; $\delta$ is oxygen defect, and having a perovskite-like crystal structure, show superconductivity at a temperature higher than the liquid nitrogen temperature these oxide materials can be produced by a substitution diffusion reaction between a substrate and a film or layer deposited on the substrate.

11 Claims, 16 Drawing Sheets

(HEAT TREATMENT)

PROCESS FOR PRODUCING SUPERCONDUCTING MATERIAL

BACKGROUND OF THE INVENTION

This invention relates to a superconducting material having a perovskite-like crystal structure and a superconducting components using the same, particularly to a superconducting material suitable for having a high superconducting transition temperature (Tc), and a process for producing the same.

Heretofore, oxide series superconducting materials and their production have been discussed, for example, in *Zeitschift fuur Physik*, *B64* (1986), pp. 189–193; *Science*, *235* (1987), pp. 567–569; *Physical Review Letters*, *58* (1987), pp. 908–910, etc.

According to the prior art technique, there have not been considered oxide superconducting materials having a Tc of 100° K. or higher and production thereof. Thus, when these materials having low Tc were used in the superconducting state, there was a problem in that cooling at the level of liquid nitrogen temperature (78° K.) was necessary.

SUMMARY OF THE INVENTION

Objects of this invention are to provide a superconducting material having a high superconducting transition temperature (Tc), preferably Tc of 150° K. or higher, superconducting components using the same, and processes for producing the same.

This invention provides a superconducting material represented by the formula:

$(L_xA_{1-x})_iMO_y$                 (1)

wherein L is at least one element selected from the group consisting of Sc, Y, lanthanide elements of atomic numbers 57 to 71 (La to Lu), Li, Na, K, Rb, Cs and Fr belonging to the group Ia of the periodic table; A is at least one element selected from alkaline earth metal elements (e.g. Ba, Sr, Ca); M is at least one element selected from the group consisting of V, Nb, Ta, Ti, Zr, and Hf, x is $0<x<1$; i is 1, 3/2 or 2; and y is $0<y\leqq 3$ in the case of i=1, or $0<y\leqq 4$ in the case of i=3/2 or 2.

This invention also provides a superconducting material represented by the formula:

$(L_xA_{1-x})_iM_{1-z}Cu_zO_y$       (2)

wherein L is at least one element selected from the group consisting of Sc, Y, lanthanide elements of atomic numbers 57 to 71 (La to Lu), Li, Na, K, Rb, Cs and Fr belonging to the group Ia of the periodic table; A is at least one element selected from alkaline earth metal elements (e.g. Ba, Sr, Ca); M is at least one element selected from the group consisting of V, Nb, Ta, Ti, Zr, and Hf, xi is $0<x<1$; z is $0<z<1$; i is 1, 3/2 or 2; y is $0<y\leqq 3$ in the case of i=1, or $0<y\leqq 4$ in the case of i=3/2 or 2.

This invention further provides a superconducing material represented by the formula:

$(L_xA_{1-x})_iMO_{j-\delta}G_K$       (3)

wherein L is at least one element selected from the group consisting of Sc, Y, lanthanide elements of atomic numbers 57 to 71 (La to Lu), Li, Na, K, Rb, Cs and Fr belonging to the group Ia of the periodic table; A is at least one element selected from alkaline earth metal elements (e.g. Ba, Sr, Ca); M is at least one element selected from the group consisting of V, Nb, Ta, Ti, Zr and Hf; x is $0<x<1$; i is 1, 3/2 or 2; j and k are j+k=3 in the case of i=1, j+k=7/2 in the case of i=3/2, or j+k=4 in the case of i=2; $\delta$ is the amount of defect of oxygen; and G is F, Cl or N.

This invention still further provides a superconducting part obtained by alternately laminating thin films of superconducting material of the formula (1), (2) or (3) and electrical insulating thin films.

This invention further provides a process for producing a superconducting material of the formula (1), (2) or (3).

DESCRIPTION OF THE PREFERRED EMBODIMENTS

Figure 1:
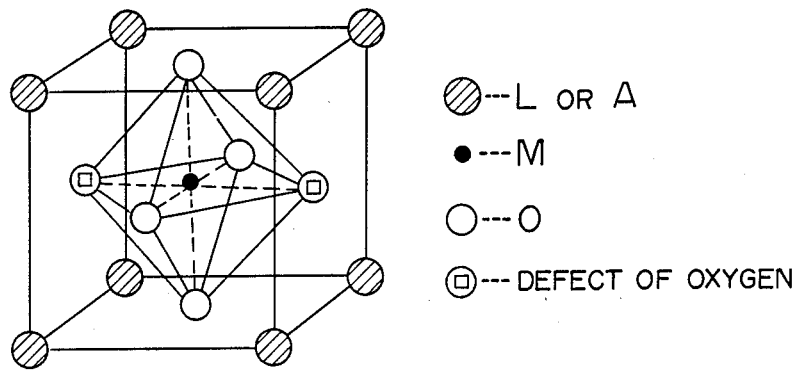
FIGS. 1 and 2 are perspective views of the crystal structures of the materials of this invention.

The superconducting materials of this invention have a perovskite-like crystal structure represented by the formulae:

$(L_xA_{1-x})_iMO_y$             (1)

$(L_xA_{1-x})_iM_{1-z}Cu_zO_y$     (2) or

$(L_xA_{1-x})_iMO_{j-\delta}G_k$      (3)

wherein L is at least one element selected from the group consisting of Sc, Y, lanthanide elements of atomic numbers 57 to 71 (La to Lu), Li, Na, K, Rb, Cs and Fr belonging to the group Ia of the periodic table; A is at least one element selected from alkaline earth metal elements (e.g. Ba, Sr, Ca); M is at least one element selected from the group consisting V, Nb, Ta, Ti, Zr and Hf; x is $0<x<1$; z is $0<z<1$; i is 1, 3/2 or 2; y is $0<y\leqq 3$ in the case of i=1, or $0<y\leqq 4$ in the case of i=3/2 or 2; j and k are j+k=3 in the case of i=1, j+k=7/2 in the case of i=3/2 or j+k=4 in the case of i=2; δ is the amount of defect of oxygen; and G is F, Cl or N.

The superconducting part of this invention can be obtained by covering exposed portions of sintered body of a molded body of the above-mentioned superconducting materials with an oxygen preventing film (passivation film), or by laminating this superconducting material with other films of electrical insulating material. It is preferable to laminate a plurality of film-like layers alternately. Further, it is preferable to use as an insulating material a perovskite-like ceramic of the same series.

Further, in the above-mentioned formulae (1) and (2), the valence number (p) of L, A and M, or L, A, M and Cu, and the valence number y of oxygen has preferably the following relationship:

$$|p| = |y| \pm 0.5$$

Further, it is preferable to include M of the valence of two.

More in detail, the material represented by the formula (1) has a perovskite-like crystal structure and has as the L element at least one element selected from the group consisting of scandium (Sc), yttrium (Y), and lanthanide elements of atomic numbers 57 to 71 (La to Lu) belonging to the group IIIb of the periodic table, lithium (Li), sodium (Na), potassium (K), and the like belonging to the group Ia of the periodic table; as the A element at least one element selected from the group consisting of barium (Ba), strontium (Sr), calcium (Ca), and the like belonging to alkaline earth metal elements of the group IIa of the periodic table; and as the M element, which is positioned at the center of an octahedron formed by oxygen (O) and oxygen vacancies, at least one element selected from the group consisting of vanadium (V), niobium (Nb) and tantalum (Ta) belonging to the group Vb of the periodic table and titanium (Ti), zirconium (Zr) and hafnium (Hf) belonging to the group IVb of the periodic table, these element being able to include Cu.

The oxide superconducting material having the perovskite-like crystal structure of this invention has as a fundamental constitution an octahedron having the M element which is an atom belonging to the group Vb or IVb as its center and 6 oxygen atoms. Since this material has an oxygen defect, that is, one or more oxygen vacancies in the octahedron, it is expected to generate a mutual action of strong attraction necessary for forming a hole pair or electron pair showing a superconducting phenomenon at a temperature of 150° K. or higher.

Figure 2:
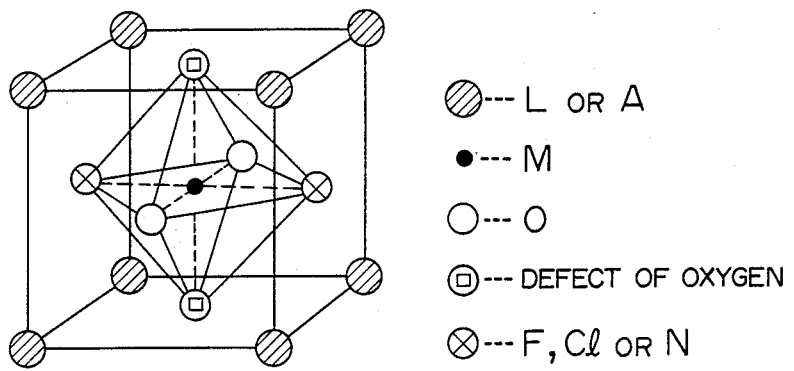

The oxide superconducting material of this invention has the perovskite-like crystal structure as shown in FIGS. 1 and 2. These drawings show unit lattices of the materials represented by the formulae:

$$(L_xA_{1-x})_iMO_y \qquad (1) \text{ and}$$

$$(L_xA_{1-x})_1MO_{j-\delta}G_k \qquad (3)$$

wherein L, A, M, G, x, y, i, j, k and δ are as defined above. As shown in FIG. 1, six oxygen atoms are arranged around the M in the formula (1) to form an octahedron. When one oxygen atom among the six oxygen atoms is deficient, there is formed a pyramid structure having M at the base, or when two oxygen atoms are deficient, there is formed a square of four oxygen atoms having M in its face center or a square of two oxygen atoms and two oxygen vacancy holes having M in its face center, singly or in combination appearing regularly to form a plurality of layers, said pyramid or square being connected two-dimensionally in the crystal. With the generation of two-dimensionally connected pyramids or squares, strong mutual attraction necessary for forming hole pairs or electron pairs showing a superconducting phenomenon is generated. The thus generated hole pairs or electron pairs showing the superconducting phenomenon seem to pass along the pyramids or squares connected two-dimensionally. By containing at least one of V, Nb, Ta, Ti, Zr, and Hf as the M element, the formation of defects of oxygen, that is, the formation of oxygen vacancy holes, is accelerated to form continuous faces obtained by combining the pyramids or squares of the M element and oxygen as fundamental components. As mentioned above, since the octahedron formed by the M element and oxygen atoms or oxygen vacancy holes (practically crystal structure of pyramid, square, etc.) seems to be essential for the superconductivity, the stable formation of such a structure seems to be sufficient, even if the elements L and A are not present.

The M element in the formula (1) can be two-component elements represented by the formula:

$$(M'_{1-z}M''_z)$$

wherein z is $0 \leq z < 1$; M' is one element selected from V, Nb, Ta, (Vb group elements) Ti, Zr and Hf (IVb group elements); and M" is one element selected from the above-mentioned Vb group and IVb group elements and Cu.

Further, in the formula (1), the A element can be replaced by two or more elements, for example, by $(A'_{1-d}A''_d)$ wherein d is $0 \leq d < 1$; and A' and A" are independently elements selected from alkaline earth metal elements such as Ba, Sr, Ca, and the like.

Suitable examples of the above-mentioned oxide superconducting materials are as follows:

$$La_xSr_{1-x}M'_{1-z}Cu_zO_{3-\delta}$$

$$(La_xSr_{1-x})_2M'_{1-z}Cu_zO_{4-\delta}$$

$$Y_xBa_{1-x}M'_{1-z}Cu_zO_{3-\delta}$$

As the so-called ABO3 type, there are LiBa2Nb3O9−δ, Y0.5Ba0.5NbO3−δ, etc.

As the so-called A2BO4 type, there are LiBaNbO4−δ, LaSrNbO4−δ, etc.

As the so-called A2B2O6 type, there are LiBa2Nb2O6−δ, and the like.

In the above-mentioned formulae, it is preferable to make x in the range of $0.4 \leq x < 0.6$, and more preferably x being about 0.5.

On the other hand, the oxide superconducting material represented by the formula (3) has the same elements L and A as those of the formulae (1) and (2) and further has oxygen (O), oxygen vacancy holes, and one element selected from F, Cl and N as the G element to form an octahedron crystal structure. The M element which is positioned at the center of the crystal structure is at least one element selected from V, Nb, Ta, Ti, Zr, and Hf. Around the M in the formula (3), oxygen, oxygen defect and G element in total number of 6 are arranged to form an octahedron as shown in FIG. 2. Thus, the line of oxygen and M element is to be connected one-dimensionally in the width of crystal. With the generation of one-dimensionally connected oxygen and M element, the strong mutual attraction necessary for forming superconducting hole pairs or electron pairs is generated. The thus generated superconducting hole pairs or electron pairs seem to pass along the one-dimensionally connected line. As the M element, at least one of V, Nb, Ta, Ti, Zr and Hf is contained. By introducing F, Cl or N as the G element, the crystal is stabilized chemically and the one-dimensional connection of the M element and oxygen is formed regularly. Thus, it seems to generate strong mutual attraction necessary for forming hole pairs or electron pairs showing superconductivity even at 150° K. or higher.

In the next place, production of the super-conducting materials represented by the formulae (1) to (3) is explained.

The material represented by the formula (1) can be produced, for example, by mixing a powder of oxide of the L element, a powder of carbonate of the A element, and a powder of oxide of the M element or pure metal of the M element in the desired stoichiometric composition, reacting the mixed powders in vacuum, reducing, or oxidizing, preferably in a weakly oxidizing atmosphere at high temperatures with heating, and sintering the reaction mixture.

Further, the superconducting material represented by the formula (1) can be obtained by substituting a part or whole of Cu in the oxide of the formula:

$$(L_xA_{1-x})_iCuO_y \qquad (4)$$

wherein L, A, x, y and i are as defined above, with another metal element. By the step of producing the oxide of the formula (4) and the step of substituting a part or whole of Cu in the formula (4) with at least one element selected from those of the group IVb and Vb, the total amount of the elements of the group IVb and Vb can exceed the amount of Cu.

It is also possible to produce an oxide superconducting powder having a perovskite-like crystal structure containing the M element mainly by mixing a powder of oxide material represented by $(L_xA_{1-x})_iCuO_y$, wherein x is $0<x<1$; i is 1, 3/2 or 2; and y is $0<y\leq4$, with a pure metal of the M element selected from the groups IVb and Vb in a weight ratio of Cu:M=1:1, carrying out substitution reaction between Cu and the M element in vacuum, and finally pulverizing the final reaction product.

It is further possible to produce an oxide superconducting powder having a perovskite-like crystal structure and containing the M element mainly by depositing in vacuum a film of pure metal of the M element selected from the elements of groups IVb and Vb on outer surface of oxide ceramic containing Cu mainly represented by $(L_xA_{1-x})_iCuO_y$, wherein x is $0<x<1$; i is 1, 3/2 or 2; and y is $0<y\leq4$, diffusing the M element at 600° to 900° C. for several hours to substitute Cu with the M element, annealing the resulting product in an oxidizing atmosphere, and pulverizing the thus obtained ceramic.

It is possible to subject an oxide material represented by the formula: $(L_xA_{1-x})_iMO_y$ (1), wherein x is $0<x<1$; i is 1, 3/2 or 2; y is $0<y\leq4$, containing the M element mainly (M being at least one element selected from elements of IVb and/or Vb) and having a perovskite-like crystal structure to annealing in an oxidizing atmosphere so as to have superconductivity.

In the annealing step, it is effective to conduct the final heating step at 600° to 900° C. for 12 to 48 hours.

It is also possible to form an oxide film having the composition of the formula (1) by diffusion reaction on a substrate made of a material of a IVb group element and/or Vb group element by direct current magnetron sputtering using a sintered body of the formula (4) as a target in an argon atmosphere under conditions of the atmosphere pressure of 0.1 to 0.8 Torr, sputtering voltage of 200 to 400V, sputtering electric current of 20 mA to 100 mA, while passing an alternating electric current directly through the substrate to maintain the substrate temperature at 1000° to 1400° C. and forming the oxide of the formula (4) on the substrate surface.

It is effective to subject the above-mentioned substrate obtained by the oxide film of the formula (1) formation step to the annealing step by heating at 500° to 600° C. for 10 to 30 minutes in a weakly oxidizing atmosphere.

An embodiment of the above-mentioned production comprises a step of using a niobium material as a substrate, passing an alternating electric current directly through the substrate to maintain it at a temperature of 1000° to 1400° C., and forming on the niobium substrate surface an oxide of La—Sr—Cu—O₄ by direct current magnetron sputtering using La—Sr—Cu—O₄ sintered body as a target in an argon atmosphere under a pressure of 0.1 to 0.8 Torr at a sputtering voltage of 200 to 400V and sputtering electric current of 20 mA to 100 mA, through which step a La—Sr—Nb—O oxide film is formed on the niobium substrate surface by diffusion reaction, followed by heat treatment of the thus obtained niobium substrate in a weakly oxidizing atmosphere at 500° C. to 600° C. for 10 to 30 minutes.

Still another embodiment of the production comprises vapor depositing a L—A—Cu—O film (L is an element selected from the group Ia metal elements and the group IIIa elements, and A is an element selected from the group IIa elements) on a substrate made of at least one member selected from IVb elements, Vb elements or alloys thereof and heated at high temperatures, and conducting substitution of Cu with the IVb and/or Vb element by the reaction between the substrate and the vapor deposited film.

In the above-mentioned process, it is effective to conduct the vapor deposition by laser beam irradiation. The stabilization of the superconducting thin film thus obtained can desirably be conducted by rapidly cooling the thin film immediately after the vapor deposition. In this process, the following elements can be used:

| | |
|---|---|
| Ia group | Li, Na, K, Rb, and Cs |
| IIa group | Be, Mg, Ca, Sr, Ba and Ra |
| IIIa group | Sc, Y, La, Ac, etc. |
| IVb group | Ti, Zr and Hf |
| Vb group | V, Nb, and Ta. |

The oxide superconducting material represented by the formula (2) having a perovskite-like crystal structure can be produced by mixing a powder of oxide of the L element, a powder of carbonate of the A element, and cupric oxide (CuO) powder, heating the mixed powders at 900° to 1000° C. in vacuum, reducing or oxidizing, preferably in a weakly oxidizing atmosphere, mixing the resulting reacted mixed powders with a powder of pure metal of the M element in the desired stoichiometric amounts, heating again the resulting mixture in vacuum, reducing, or oxidizing, preferably in a weakly oxidizing atmosphere for reaction, and sintering the reaction mixture.

It is also possible to form an oxide super-conducting film having layers of a perovskite-like crystal structure by using at least 3 kinds of metal elements not limited to the above-mentioned composition, depositing a mixture of at least two kinds of metal elements on the rest of metal film, and subjecting the metal film and the deposited layer to the diffusion reaction by heat treatment. It is preferably to form a concentration gradient of the constituent metal element composition in the thickness direction by the diffusion reaction in the oxide superconducting film.

Further, it is possible to form an oxide superconducting thin film represented by the formula (1) and having a perovskite-like crystal structure on a substrate of at least one of silicon (Si) single crystal, aluminum oxide ($Al_2O_3$) single crystal, silicon oxide ($SiO_2$) single crystal, magnesium oxide (MgO) single crystal and zirconium oxide ($ZrO_2$) single crystal by forming a metal thin film of the M element on the substrate, depositing a film of a mixture of the L element and A element ($L_xA_{1-x}$ film, and $0<x<1$), and subjecting to heat treatment to react these elements. In addition, it is possible to obtain an oxide super-conducting material represented by the formula (1) and having a perovskite-like crystal structure by depositing a film of a mixture of the L element and the A element ($L_xA_{1-x}$ film, and $0<x<1$) on a metal tape or substrate of the M element, and heat treating to conduct the reaction of these elements.

It is also effective to form an oxide super-conducting film represented by the formula (2) and having a perovskite-like crystal structure by using as a substrate at least one of silicon (Si) single crystal, aluminum oxide ($Al_2O_3$) single crystal, silicon oxide ($SiO_2$) single crystal, magnesium oxide (MgO) single crystal, and zirconium oxide ($ZrO_2$) single crystal, forming a metal thin film of the M element on the substrate, depositing an amorphous or polycrystalline film containing the L element, A element, Cu and O [$(L_xA_{1-x})_iCuO_y$] on the metal thin film, and performing a heat treatment to diffuse the M element into the film of $(L_xA_{1-x})_iCuO_y$.

In this invention, it is possible to include small amounts of Cu, F, Cl, N and the like in addition to the above-mentioned constituent elements. The copper sometimes remains during the production process. When F is retained, the most preferably form is represented by the formula (3) having a perovskite-like structure, wherein the L element is at least one element selected from the group consisting of Sc, Y, lanthanide elements of atomic numbers 57 to 71 (La to Lu), Li, Na, K, Rb, Cs and Fr; the A element is at least one element selected from the group consisting of alkaline earth metals such as Ba, Sr and Ca; the M element, which is positioned at the center portion of the octahedral crystal structure, is at least one element selected from the group consisting of V, Nb, Ta, Ti, Zr and Hf; and a part or whole of the oxygen (O) is replaced by F, Cl or N. Such a material of the formula (3) can be produced by mixing a powder of oxide of the L element, a powder of a fluoride or chloride of the A element, and a powder of oxide of the M element or pure metal of M element in the desired stoichiometric amounts, heating the mixed powders at high temperatures in an oxidizing atmosphere to carry out the reaction, and sintering the reaction mixture. It is also effective to use a process wherein the heat treatment is conducted in an oxidizing atmosphere containing a fluorine gas or a chlorine gas, followed by gradual cooling in the same atmosphere as mentioned above, or to use a process wherein the heat treatment is conducted in an oxidizing atmosphere, followed by doping of fluorine or chlorine ions by an ion implantation method.

Polycrystalline or crystalline oxide super-conducting materials represented by the formula (1) or (2) can be produced by heating a mixture containing the L element, A element and M element in predetermined stoichiometric amounts at high temperatures in vacuum, reducing or oxidizing, preferably in a weakly oxidizing atmosphere to carry out the reaction, obtaining a powder of amorphous or polycrystalline oxide of the above-mentioned mixture, molding the powder and sintering the molded product.

It is also possible to produce polycrystalline or crystalline oxide superconducting materials represented by the formula (1) or (2) by forming a film containing the L element, A element and M element in predetermined stoichiometric compositional proportions on a tape or substrate, and heating the film in vacuum, reducing or oxidizing, preferably in a weakly oxidizing atmosphere to carry out the reaction.

The elements belonging to the group Vb and IVb can take on a plurality of valence numbers. Those having the higher valence number (e.g. Nb in $Nb_2O_5$ and the like having a higher oxygen element ratio) are generally stable. Elemental single bodies or low-oxygen-content compounds can generally be changed into those having the highest oxygen element ratio by heating in an oxidizing atmosphere. Therefore, particularly preferably raw material ceramics are NbO, TaO, VO, ZrO, TiO, HfO and the like. By retaining those having a variety of valences in the perovskite-like molded product, the change of valence (e.g. valence 2 ($\leftarrow$, $\rightarrow$) valence 5) takes place in the molded product to probably enhance the stability.

It is preferable to make the valence of oxygen (y) equal to the total valences of L, A and M elements (p) in the range of $\pm 0.5$ (i.e., $|p|=|y| \pm 0.5$). The meaning of the value $\pm 0.5$ is that slight excess and deficiency of oxygen defects is immaterial.

The above-mentioned production processes are explained more in detail.

For example, an oxide superconducting material represented by the formula (1) and having a perovskite-like crystal structure can be produced by reacting a powdery mixture of an oxide of the L element, a carbonate of the A element and CuO in the predetermined stoichiometric amounts, these elements being known to easily be reacted, at about 900° C. in air or oxidizing atmosphere for several hours, press molding the resulting product, sintering at 950° C. to 1100° C. to give a powder or sintered body (ceramic) having a perovskite-like crystal structure containing mainly Cu and carrying out a substitution reaction of the Cu in the powder or sintered body with the M element in vacuum or oxidizing atmosphere with heating. Further, by annealing the resulting product in an oxidizing atmosphere, superconductivity can be obtained.

A copper oxide of the formula (4) $\{(L_xA_{1-x})_iCuO_y\}$ having a perovskite-like crystal structure can easily be obtained stably in air or an oxidizing atmosphere. Thus, an oxide containing an M element mainly and represented by the formula (1) $\{(L_xA_{1-x})_iMO_y\}$ having a perovskite-like crystal structure, which is difficult to be synthesized in an oxidizing atmosphere, can easily be produced by the previously described step of forming the above-mentioned copper oxide which is used for determining the crystal structure and a later step of substituting the Cu element with the M element.

On the other hand, it is conceivable to vapor deposit on a substrate such as sapphire, magnesia, strontium titanate, etc., and to make the vapor deposited film superconductive by subjecting it to the high temperature treatment after vapor deposition or maintaining the substrate at high temperatures during the vapor deposition. But it is well known that during the maintenance at high temperatures, the constituent elements of the substrate diffuse into the vapor deposited film to deteriorate superconducting properties. In order to prevent this, it is conceivable to conduct a thermal treatment at lower temperatures, or a low-temperature deposition as well as to previously deposit a diffusion preventing film on the substrate.

According to this invention, the reaction between the substrate and the vapor deposited film is not prevented, but is positively utilized to produce a superconductive thin film.

The materials typically represented by the formula (1) such as La—Sr—Nb—O series materials are known to have the possibility of showing superconductivity at higher temperatures than the materials of Y—Ba—Cu—O and La—Ba—Cu—O series. According to this invention, a La—Sr—Cu—O film is vapor deposited on a niobium substrate to react the niobium of the substrate with the vapor deposited film. The niobium of the substrate diffuses into the vapor deposited film to substitute for the copper in the film so to form a La—Sr—Nb—O film, while the substituted copper is liberated and vaporized from the film to deposit on a vacuum vessel wall or a cooling wall.

Further, in a step of forming a La—Sr—Cu oxide film on a niobium substrate at a high temperature of 1000° C. to 1400° C., the niobium substrate and the La—Sr—Cu—$O_4$ films are subjected to a diffision reaction to form a La—Sr—Nb—O layer on the surface of the niobium substrate. In the thus formed layer, there is formed a compositional gradient of La and Sr, and thus a stable La—Sr—Nb—O series superconducting body can be formed in the layer with good reproducibility.

In the superconducting material obtained by this invention, the positional relationship between the Cu corresponding portion (Nb, V, etc.) and the oxygen strongly influences the superconducting properties, and thus the La and Sr corresponding portion seems to contribute to the formation and maintenance of the predetermined chemical structure.

In the next place, processes for producing the perovskite-like superconducting materials of this invention are explained concretely.

Production of $(La_xSr_{1-x})_2NbO_y$ by mixing starting material powders

Lanthanum oxide ($La_2O_3$) powder, strontium carbonate ($SrCO_3$) powder and niobium oxide (NbO, $NbO_2$, $Nb_2O_5$) powder or pure metallic niobium (Nb) powder are weighed in predetermined stoichiometric amounts, and mixed to react at about 900° to 1500° C. for several hours in an oxidizing atmosphere. When $Nb_2O_5$ is used, the temperature of 1300° to 1500° C. is preferable. When Nb is used, the temperature of 900° to 1100° C. is preferable. The resulting reaction mixture is pulverized, press molded into a suitable shape, and sintered at a temperature slightly higher than the above-mentioned reaction temperature to provide an oxide superconducting material having a desired shape.

Production of $(La_xSr_{1-x})_2NbO_y$ by sputtering

La—Sr—Cu—O is used as a target. As a substrate, a pure Nb plate of 15 μm thickness is used. Sputtering is carried out at a substrate temperature of 1200° C. In this case, a substrate supporting plate is connected to a liquid nitrogen tank to rapidly cool the substrate to the liquid nitrogen temperature when a heater for the substrate is turned off. The sputtering is conducted in an argon atmosphere at a pressure of 0.5 to 0.7 Torr. After rapid cooling, the substrate is placed in an oxygen atmosphere of 2 Torr at 500° C. for 5 minutes. By the sputtering at 1200° C., the Cu in the starting material is substituted with Nb. The thus obtained thin film can provide a sample of 15 μm thick.

X-ray diffraction pattern of the thus produced sintered body of $(La_{0.5}Sr_{0.5})_2NbO_4$ shows peaks of $2\theta$ at 24.6°, 31.1°, 33.6°, 43.2°, 47.9°, 54.6°, 55.4°, and 65.4°. The sintered body is crystallized and is almost black in black.

According to the present inventors' measurement, $2\theta$ of the same series materials (i=2 in the formula (1), e.g. (L.A):M=2:1) is the same as $2\theta$ of $(La_{0.5}Sr_{0.5})_2NbO_4$.

Figure 3:
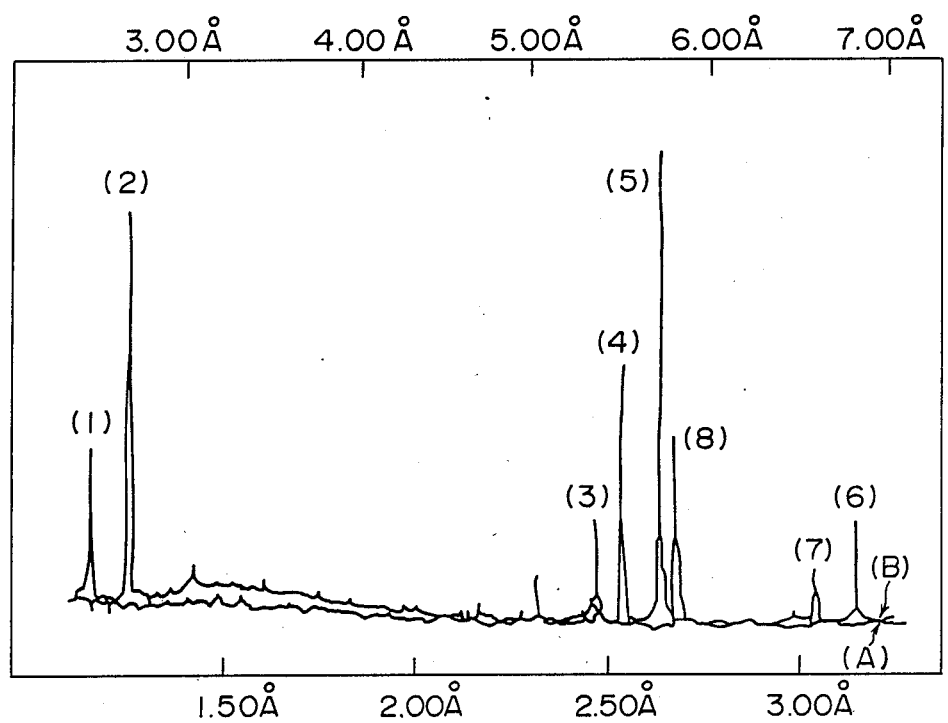
FIG. 3 is a graph showing EPMA (Electron Probe Micro Analyzer) analysis data of one example of the material of this invention.

EPMA analysis of $LaSrNbO_y$ (y is estimated to be 4) thus obtained is shown in FIG. 3. The results of X-ray diffraction are the same as the above-mentioned $2\theta$ data. From other properties and the analysis values of FIG. 3, this oxide has the above-mentioned composition and is identified as a superconducting material having a perovskite-like crystal structure. In FIG. 3, (1) is $LaL\beta$ 2.4583 Å, (2) is $LaL\alpha$ 2.6851 Å, (3) is $LaL\beta$ 2.4583 Å, (4) is $NbL\beta$ 5.4914 Å, (5) is $NbL\alpha$ 5.7235 Å, (6) is $SrL\beta$ 6.6234 Å, (7) is $SrL\alpha$ 6.8624 Å, and (8) is $LaL\alpha$ 2.6651 Å.

Figure 4:
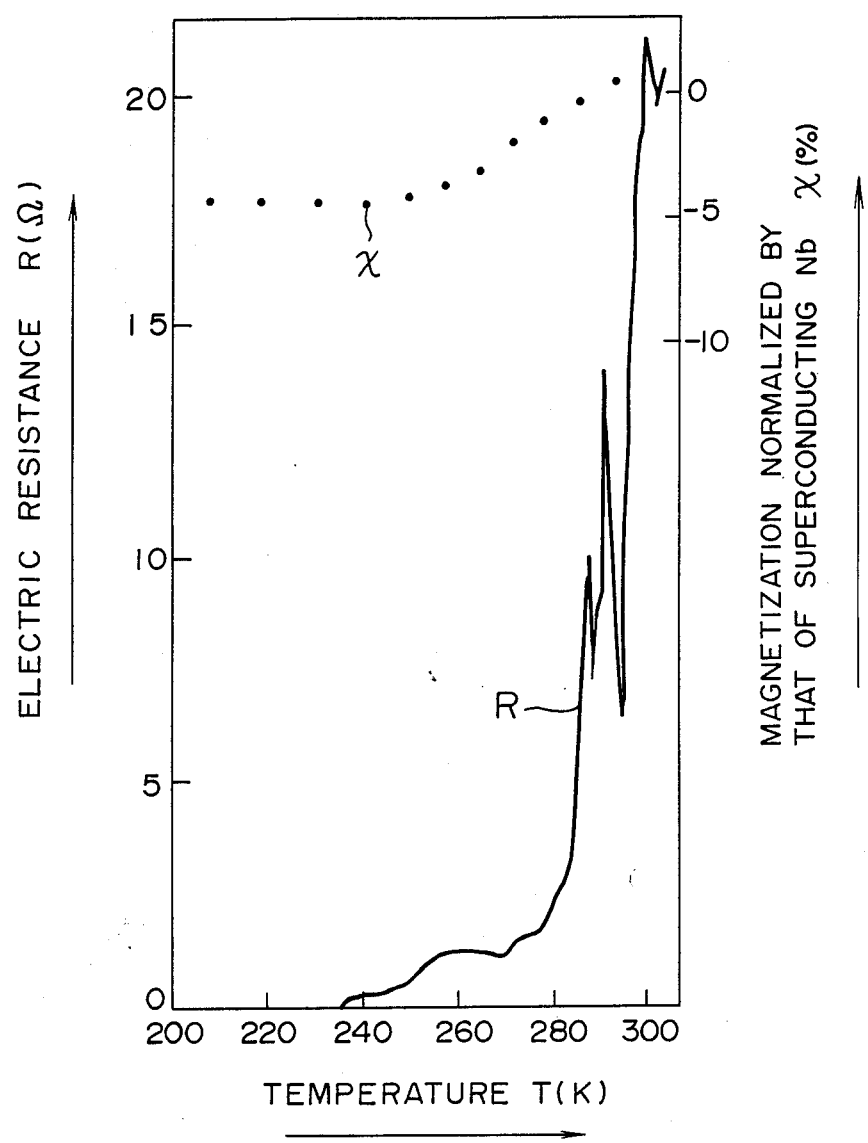
FIGS. 4 to 7 are graphs showing a relationship between electric resistance and temperature.
Figure 5:
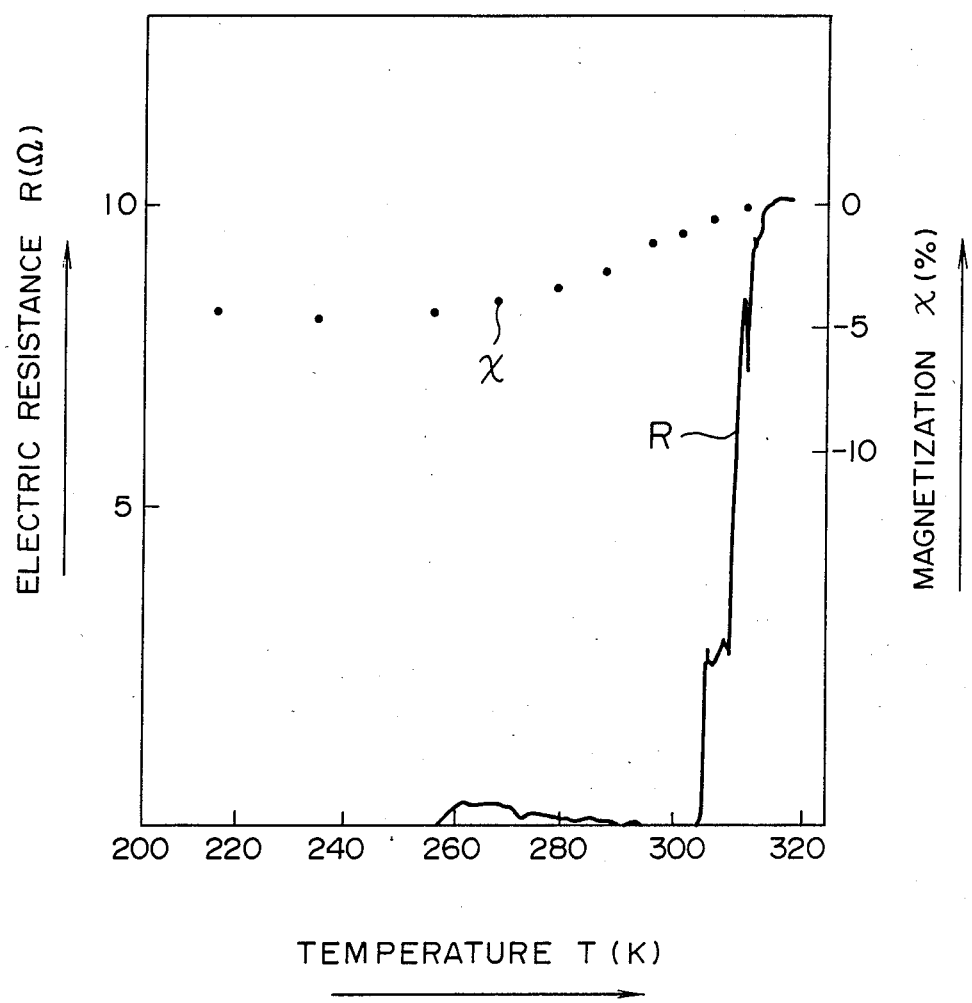

Properties of $LaSrNbO_4$ immediately after sintering are shown in FIG. 4. Using the same sample as that used for measuring the properties of FIG. 4 and lowering the sample temperature to 200° K., the electric resistance is measured again and shown in FIG. 5. As is clear from FIG. 5, the reproducibility is good and considerable stability is obtained. As shown in FIG. 5, the electric resistance of this material begins to decrease at 315° K. and becomes zero at 300° K. and completely zero at 255° K. even if a slightly noisy region on measuring is removed. On the other hand, as shown in χ (%) in FIGS. 4 and 5, the Meissner effect is also observed. χ means magnetization compared with the complete superconducting standard (Nb at 4.2° K.). When this ratio is negative, the Meissner effect is exhibited, and χ = −100% means complete superconductivity. The electric current used in measuring the resistance was 3 $mA/cm^2$.

It is possible to obtain the desired super-conductivity characteristics by subjecting the sample to the above-mentioned temperature cycle. Further, it is possible to use an apparatus employing superconductivity by limiting the temperature range showing the desired properties. For example, if there is a region temporarily showing a complete zero of the resistance, for example at 300° K. as shown in FIG. 5, use of this region or use as a switching material employing this region (due to the change in the resistance in the upper temperature region and the lower temperature region) becomes possible.

Processes for producing the materials of this invention by substituting the Cu portion of so-called perovskite-like starting materials containing Cu by sputtering will be explained later.

Production of $Y_xBa_{1-x}NbO_y$

Powders of $Y_2O_3$, $BaCO_3$ and $Nb_2O_5$ or pure metallic Nb as starting materials are weighted in predetermined amounts, mixed and subjected to heat treatment at high temperatures. The thus obtained reaction mixture powders are molded and sintered to give the desired oxide superconducting materials.

The thus obtained sintered body $\{Y_{0.4}Ba_{0.6}NbO_3\}$ has peaks of $2\theta$ when measured by the X-ray diffraction method at 22.7°, 32.7°, 38.5°, 40.3°, 46.6°, 47.5°, 58.2°, 58.9° and 68.8°. The sintered body is crystallized and is almost black in color.

According to the present inventors' measurement, $2\theta$ of the same series materials (i=1 in the formula (1)) is the same as that of the above-mentioned $(Y_xBa_{1-x})NbO_y$ and shows peaks at 32.6°, 38.5°, 40.4°, 47.0°, 58.5°, etc. The sintered body is crystallized and is almost black in color.

Figure 6:
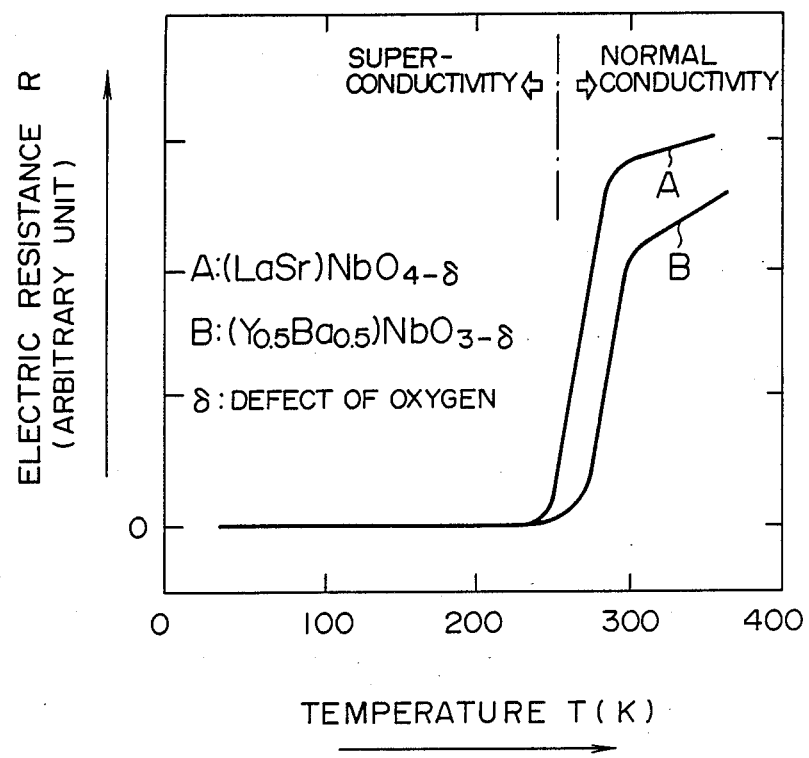

Temperature dependency of electric resistance of the sintered bodies thus obtained, i.e.

$$(La_xSr_{1-x})_2NbO_y$$

wherein $0 < y \leq 4$, $x = 0.5$, and $$Y_xBa_{1-x}NbO_y$$

wherein $x = 0.5$ and $0 < y \leq 3$, is shown in FIG. 6. Since these properties are changed greatly by the stoichiometirc proportions, and heat treatment conditions (sintering temperature pattern, atmosphere at the time of sintering, annealing conditions, etc.), the data in FIG. 6 are only examples and not limited thereto. The electric resistance is lowered with a decrease of temperature and is rapidly lowered at about 280° K. and becomes completely zero at about 250° K. That is, the superconducting state begins at about 280° K. and is completely attained at about 250° K. In this case, the transition width is as large as 30° K., but this can be reduced remarkably by properly selecting the heat treatment conditions during the sintering, and annealing conditions after sintering.

The reaction temperature of the starting material mixed powders and the heat treatment temperature at the time of sintering can be lowered by substituting the M element with Cu as in the case of $(L_xA_{1-x})_iM_{i-z}Cu_zO_y$ ($0 < z < 1$). In this case, there is no great deterioration in the superconductivity characteristics.

Use of two or more elements as L

Superconducting materials can also be obtained when two or more elements are used as the L element. For example, there can be obtained $$(Sc_aY_{1-a})_x Ba_{1-x}NbO_y$$

wherein y is estimated as 7; a is $0 < a < 1$; and x is $0 < x < 1$. As the starting material powders, there can be used $Sc_2O_3$, $Y_2O_3$, $BaCO_3$ and NbO or pure Nb (treatment in a reducing atmosphere in the case of using pure Nb). There can be obtained $2\theta$ of the same series material (i=1 in the formula (1)). More concretely, there is obtained the following material represented by the formula:

$$Sc_{0.2}Y_{0.2}Ba_{0.6}NbO_{7-\delta}$$

Use of Ia group element as L

When Li is used as an example of the Ia group element as the L element, $Li_2O$ powder is used as a starting material. The resulting material can be represented by formula:

$$Li_xBa_{1-x}NbO_{7-\delta}$$

wherein x is $0 < x < 1$. The same $2\theta$ as obtained when i=1 in the formula (1) is obtained. More concretely, there is obtained the following material represented by the formula:

$$Li_{0.5}Ba_{0.5}NbO_{7-\delta}$$

Production of $La_xSr_{1-x}ZrO_y$

Oxide superconducting materials can be produced by weighing powders of $La_2O_3$, $SrCO_3$, and $ZrO_2$ or pure metallic Zr as starting materials to obtain the desired compositions, mixing the starting materials, heat treating the mixed starting materials at high temperatures, molding the resulting reacted mixture powder, and sintering the molded product. More concretely, these is obtained the following material represented by the formula:

$$La_{0.5}Sr_{0.5}ZrO_{3-\delta}$$

Production of $Y_xBa_{1-x}ZrO_y$

Oxide superconducting materials can be produced by weighing powders of $Y_2O_3$, $BaCO_3$, and ZrO or pure Zr as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$Y_{0.5}Ba_{0.5}ZrO_{3-\delta}$$

Production of $La_xSr_{1-x}TaO_y$

Oxide superconducting materials can be produced by weighing powders of $La_2O_3$, $SrCO_3$, and $Ta_2O_3$ and/or TaO or pure metallic Ta as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$La_{0.5}Sr_{0.5}TaO_y$$

Production of $Y_xBa_{z-x}TaO_y$

Oxide superconducting materials can be produced by using powders of $Y_2O_3$, $BaCO_3$, and $Ta_2O_3$ or TaO or pure Ta as starting materials. More concretely, there is obtained the following material represented by the formula:

$$Y_{0.5}Ba_{0.5}TaO_y$$

As explained above, in the production of the oxide superconducting materials represented by the formula (1): $(L_xA_{1-x})_iMO_y$ and having a perovskite-like crystal structure, there can be used as starting materials oxides of the L element such as $Y_2O_3$, $La_2O_3$, $Sc_2O_3$, $Yb_2O_3$, $Er_2O_3$, $Ho_2O_3$, $Dy_2O_3$, etc.; carbonates of the A element such as $BaCO_3$, $SrCO_3$, $CaCO_3$, etc.; and oxides of the M element such as VO, NbO, $NbO_2$, $Nb_2O_5$, TaO, $Ta_2O_3$, TiO, $TiO_2$, ZrO, $ZrO_2$, HfO, $HfO_2$, etc., or pure metals of the M element such as V, Nb, Ta, Ti, Zr, Hf, etc.

Production of $\{L_x(A'_{1-d}A''_d)_{1-x}\}_iMO_y$ ($0 \leq d < 1$)

Two elements are used as the A element in the formula (1): $(L_xA_{1-x})_iMO_y$. For example, in the case of $\{La_x(Sr_{1-d}Ca_d)_{1-x}\}_iMO_y$, oxide superconducting materials can be produced by weighing powders of $La_2O_3$, $SrCO_3$, $CaCO_3$ and oxides of M element or pure metallic M element as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$La_{0.5}(Sr_{0.8}Ca_{0.2})_{0.5}NbO_3$$

Production of $(L_xA_{1-x})_iM'_{1-z}M''_{1-z}O_y$

Two elements are used as the M element in the formula (1): $(L_xA_{1-x})_iMO_y$. For example, in the case of $(L_xA_{i-x})_iNb_{1-z}Zr_zO_y$, oxide superconducting materials can be produced by weighing powders of oxides of the L element, carbonates of the A element, NbO, and $ZrO_2$ or Nb and Zr as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$La_{0.5}Sr_{0.5}Nb_{0.5}Zr_{0.5}O_3$$

Production of $(La_xSr_{1-x})_2NbO_{j-\delta}F_k$

Lanthanum oxide ($La_2O_3$) powder, strontium fluoride ($SrF_2$) powder and niobium oxide (NbO, $NbO_2$, $Nb_2O_5$) powder are weighed in predetermined stoichiometric amounts. Mixed starting materials are reacted at 800° to 1000° C. for several hours in an oxidizing atmosphere including a fluorine gas. The resulting reaction mixture is pulverized, press molded into a suitable shape, and sintered at a temperature slightly higher than the above-mentioned reaction temperature to provide a perovskite-like superconducting ceramic having a desired shape. More concretely, there is obtained the following material represented by the formula:

$$LaSrNbO_{2-\delta}F_2$$

Production of $(Y_xBa_{1-x})_2NbO_{3-\delta}F_k$

Perovskite-like superconducting ceramics can be produced by weighing powders of $Y_2O_3$, $BaF_2$ and NbO or pure metallic Nb as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$Y_{0.5}Ba_{0.5}NbO_{2-\delta}F$$

Production of $(Y_xBa_{1-x})_2NbO_{3-\delta}Cl_k$

Perovskite-like superconducting ceramics can be produced by weighing powders of $Y_2O_3$, $BaCl_2$ and NbO as starting materials to obtain the desired compositions, mixing the starting materials, heat treating the mixed starting materials at high temperatures, molding the resulting reacted mixture powder, and sintering the molded product. More concretely, there is obtained the following material represented by the formula:

$$Y_{0.5}Ba_{0.5}NbO_{2-\delta}Cl$$

Figure 7:
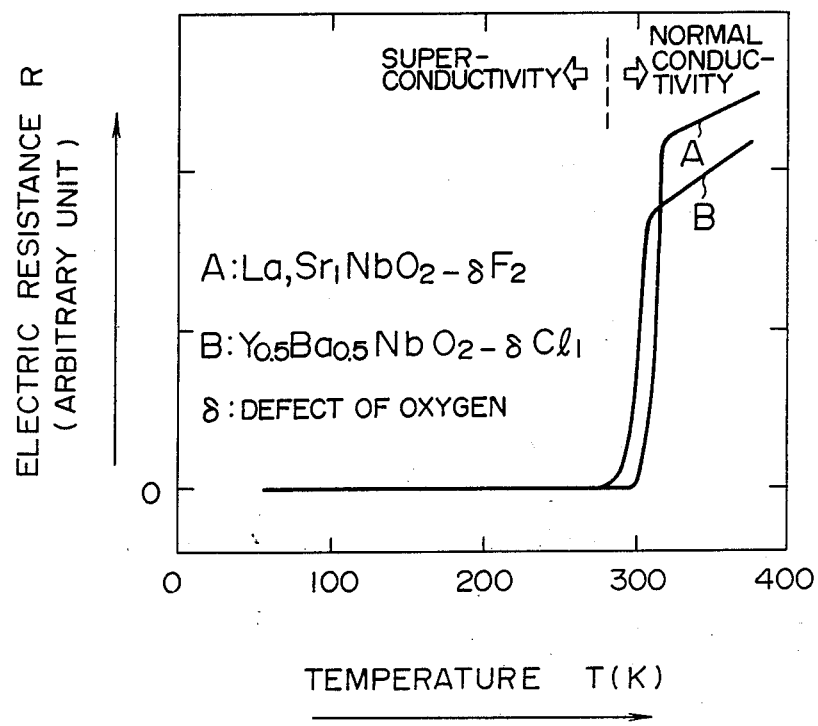

Temperature dependency of electric resistance of the sintered bodies thus obtained, i.e.

$$LaSrNbO_{2-\delta}F_2, \text{ and}$$

$$Y_{0.5}Ba_{0.5}NbO_{2-\delta}Cl$$

is shown in FIG. 7. Since these properties are changed greatly by the stoichiometric properties and heat treatment conditions (sintering temperature pattern, atmosphere at the time of sintering, annealing conditions, etc.), the data in FIG. 7 are only examples and not limited thereto. The electric resistance is lowered with a decrease of temperature and is rapidly lowered at about 320° K. and becomes completely zero at about 300° K. That is, the superconducting state begins at about 320° K. and is completely attained at about 300° K. In this case, the transition width is as large as about 20° K., but this can be reduced remarkably by properly selecting the heat treatment conditions during the sintering, and annealing conditions after sintering. Further, these substances are chemically stable sufficiently and hardly change their superconducting properties with the lapse of time.

As explained above, in the production of the superconducting materials represented by the formula (3): $(L_xA_{1-x})_iMO_{j-\delta}G_k$ and having a perovskite-like crystal structure, there can be used as starting materials oxides of the L element such as $Y_2O_3$, $La_2O_3$, $Sc_2O_3$, $Yb_2O_3$, $Er_2O_3$, $Ho_2O_3$, $Dy_2O_3$, etc; fluorides of the A element such as $BaF_2$, $SrF_2$, $CaF_2$, etc., or chlorides of the A element such as $BaCl_2$, $SrCl_2$, $CaCl_2$, etc.; and oxides of the M element such as NbO, $NbO_2$, $Nb_2O_5$, VO, $ZrO_2$, $TiO_2$, etc. Further, as the source of the A element, there can be used mixtures of carbonates of the A element such as $BaCO_3$, $SrCO_3$, $CaCO_3$, etc., and fluorides or chlorides of the A element. As the source of the M element, it is possible to use fluorides, chlorides or nitrides of the M element.

Since the reaction temperature of the starting material mixed powders, reaction time and the like reaction atmospheric conditions, and sintering conditions are changed depending on the difference in elements used, the difference in compositional ratios, the state of powders, and the like these conditions should be selected properly depending on the desired purpose. Particularly when a pure metal powder is used as the M element, since the reaction is vigorous in an oxidizing atmosphere, it is preferable to carry out the heat treatment in a reducing atmosphere. When fluoride is used as the G element, it is preferable to use an oxidizing atmosphere including fluorine. Further when chlorine is used as the G element, it is preferable to use an oxidizing atmosphere including chlorine.

If the amount of the G element (F, Cl or N) is smaller than the predetermined amount after sintering, ions of the G element can be doped by, for example, ion plantation.

Production of thin films of superconducting materials

Oxide superconducting thin films of this invention with the desired shapes and thicknesses can directly be formed on a substrate of Si single crystal, $Al_2O_3$ single crystal, $SiO_2$ single crystal, MgO single crystal, $ZrO_2$ single crystal, or $Al_2O_3$ ceramic substrate by sputtering using the ceramics obtained by the sintering method as mentioned above as a target in an argon atmosphere or an oxidizing atmosphere with a suitable oxygen partial pressure, or an argon atmosphere having a suitable oxygen partial pressure and fluorine or chlorine partial pressure. If fine film thickness adjustment and stoichiometric compositional ratio adjustment are necessary, it is preferable to deposit films by using, for example, a molecular beam epitaxy method. Needless to say, other conventionally known film forming methods such as physical methods, chemical methods, physiocochemical methods can be used. If the amount of the G element is insufficient after film formation, it can be supplemented by, for example, an ion implantation method.

Production of $(L_xA_{1-x})_iM_{1-z}Cu_zO_y$

Figure 8:
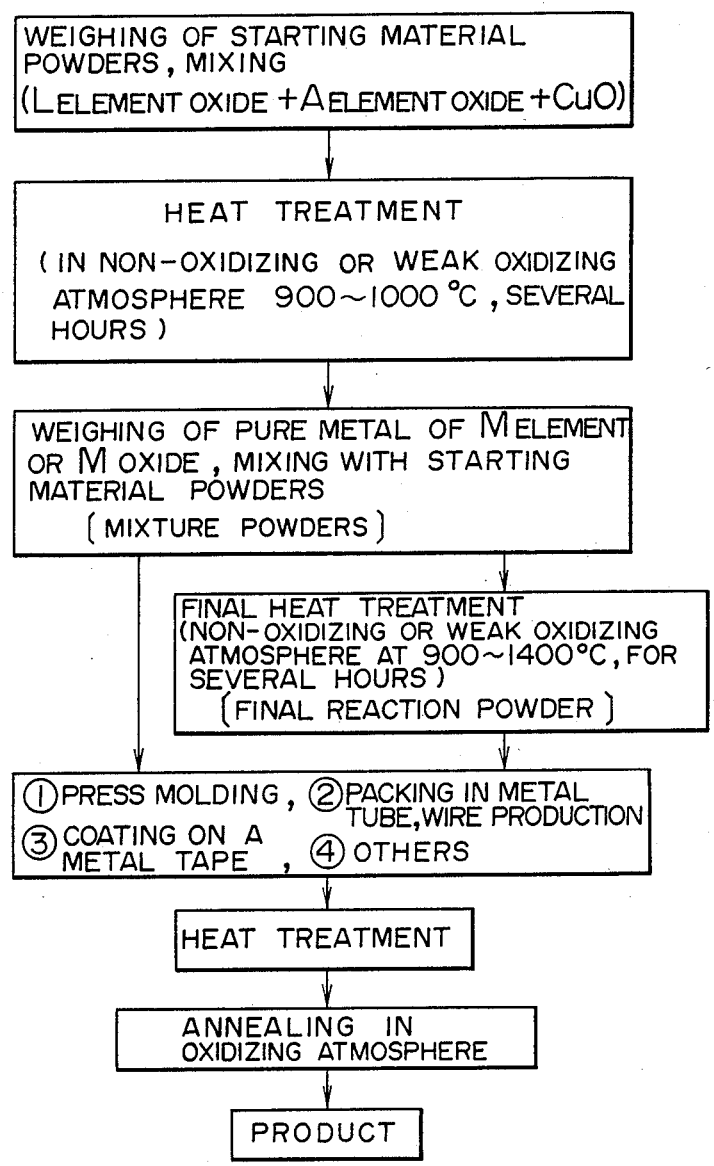
FIGS. 8 and 9(a) to 9(c) show steps of processes of this invention.

A process for producing materials containing Cu is explained referring to FIG. 8. An oxide powder of an L element, a carbonate powder of an A element, and CuO powder are weighed to give the desired compositions. The mixed powders are reacted at 900° to 1000° C. in an oxidizing atmosphere with heating. With the reacted mixture powder, one or more pure metal powders of the M element selected from V, Nb and Ta belonging to the Vb group or Ti, Zr, and Hf belonging to the IVb group are weighed and mixed. The resulting mixed powders are subjected to heat treatment again in vacuum, reducing or oxidizing, preferably in a weakly oxidizing atmosphere (in the latter case, the atmosphere is adjusted so as not to oxidize Nb(II)O to $Nb_2(V)O_5$) to give a powder of $(L_xA_{1-x})_iM_{i-z}Cu_zO_y$. The resulting powder is press molded and sintered to produce an oxide superconducting material having a suitable shape. Further, the reacted mixture powder obtained in the initial step or the final reaction powder can be packed in a tube of a metal such as copper or adhered to a metal tape as a film, followed by reaction and sintering to produce superconducting wires by using the oxide superconducting materials of this invention. After sintering, it is preferable to conduct annealing in an oxidizing atmosphere.

Formation of thin films of oxide superconducting materials

Oxide superconducting thin films of this invention with the desired shapes and thicknesses can be directly formed on Si single crystal, $Al_2O_3$ single crystal, $SiO_2$ single crystal, MgO single crystal, $ZrO_2$ single crystal or a substrate of these polycrystalline bodies by sputtering using the ceramics (bulk bodies) obtained by the above-mentioned sintering method in an argon atmosphere or in an argon atmosphere having a suitable oxygen partial pressure. If fine film thickness adjustment and stoichiometric compositional ratio adjustment are necessary, it is preferable to deposit films by using, for example, a molecular beam epitaxy method. Needless to say, other conventional known film forming methods such as physical methods, chemical methods, physicochemical methods can be used. In either case, by making the film growth conditions the most suitable, superconductivity can be obtained showing the same tendency as shown in FIG. 6.

Figure 9A:
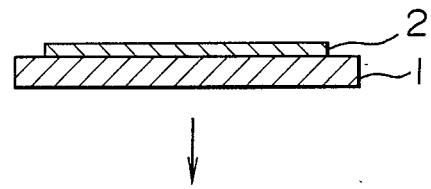
Figure 9B:
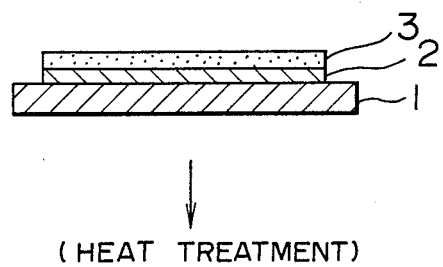
Figure 9C:
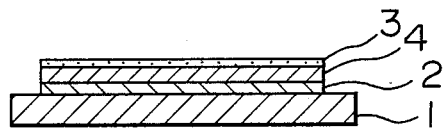

It is also possible to employ a method as shown in FIG. 9, wherein a metallic thin film 2 of the M element is grown on a substrate 1 of $Al_2O_3$ single crystal (FIG. 9(a)), a film 3 having a suitable stoichiometric compositional ratio of the L element and A element is deposited on the film 2 (FIG. 9(b)), then the metal thin film 2 and the film 3 are reacted by heat treatment to convert a part or whole of the portions of the films 2 and 3 into an oxide super-conducting thin film 4 (FIG. 9(c)). In this case, it is possible to deposit the film 3 of the L element and A element first, and then to grow the M metal thin film 2, followed by the heat treatment to obtain the same effect.

When a thin film of the superconducting material of this invention is used as an electrical wiring on a substrate, it is possible to form a film with the desired pattern on an electrically insulating ceramic substrate by screen printing, followed by firing. Similarly, it is also possible to produce a multi-layered wiring ceramic substrate.

Production of tapes of oxide superconducting material

On a metallic tape of an M element (V, Nb, Ta, Ti, Zr or Hf), a film of an L element (at least one element selected from Sc, Y, lanthanide elements of atomic numbers 57 to 71) and an A element (Ba, Sr or Ca) in a suitable stoichiometric composition $(L_xA_{1-x}, 0<x<1)$ (in the case of sputtering, a Cu-containing material such as $LaSrCuO_{3-\delta}$ or the like can be used as a target) is formed by a conventional film depositing method such as a sputtering method or a powder coating baking method, followed by heat treatment to subject a part or whole of the M element metal tape to the substitution reaction, or diffusion reaction or both reactions in combination.

Oxide superconducting wires can be produced by forming a film of $L_xA_{1-x}$ on the surface of a metallic wire made of copper, copper alloy or stainless steel as a base material, depositing a metallic film of the M element, and performing heat treatment to carry out the reaction. In this case, a plurality of the $L_xA_{1-x}$ films and the M element metallic films are laminated alternately, the reactivity at the time of heat treatment can be improved remarkably.

Production of $(L_xA_{1-x})_iM_{1-z}Cu_zO_y$

On a substrate such as $Al_2O_3$ single crystal, metallic film of an M element is first formed, and a film of $(L_xA_{1-x})_iCuO_y$ is deposited thereon in an inert atmosphere, followed by heat treatment in vacuum, reducing, or oxidizing atmosphere to diffuse the M element metallic atom and to substitute the Cu atom with the M element. In this case, when a plurality of the M element metallic films and oxide films of $(L_xA_{1-x})_iCuO_y$ are laminated alternately, the substitution of Cu atom by the M element can be enhanced by the heat treatment. Further, there can be employed other processes such as forming a M element metallic film on an oxide ceramic substrate made of $(L_xA_{1-x})_iCuO_y$, followed by heat treatment.

According to the above-mentioned illustrations, there can easily be obtained oxide superconducting materials having a Tc of 150° K. or higher, those having a Tc of 200° K. or higher, and those having a Tc of 250° K. or higher as shown in FIG. 6.

Influence of oxygen and prevention of oxygen infiltration

In FIG. 8, the heat treatment is conducted in a non-oxidizing or weak oxidizing atmosphere, but it can be conducted in vacuum or in an oxidizing atmosphere. When the heat treatment is conducted in an oxidizing atmosphere, it is necessary to adjust the conditions so as not to enhance the oxidation number (valence number and oxygen content) of the oxidizing components in the starting materials of IVb and Vb.

Valence numbers of components constituting produced oxide superconducting materials having a perovskite-like crystal structure can be summarized as follows:

TABLE 1

| Type | ABO₃ | | | | A₂BO₄ | | | | A₂B₂O₆ | | | |
|---|---|---|---|---|---|---|---|---|---|---|---|---|
| Element | Li | Ba₂ | Nb₃ | O₇ | Li | Ba | Nb | O₄ | Li | Ba | Nb₂ | O₆ |
| Valence number of constituting element | +1 | +2 +2 +14 | +2 +2 +5 +5 | −2 X 7 −14 | +1 | +2 | +5 | −2 X 4 −8 | +1 | +2 +2 +12 | +2 +2 | −2 X 6 −12 |
| | | | | | | | +8 | | | | | |

As mentioned above, when the total valence number of oxygen and the total valence number of other elements are substantially balanced, there can be obtained stable (less deteriorating) materials. In this case, a slight excess and deficiency of oxygen defect is immaterial, and the difference between the total valence numbers in the range of ±0.5 causes no damage. In practice, valence numbers of the same element change mutually (e.g. in the case of Nb, valence 2 ⟷ valence 5) in the perovskite-like materials, so that it is preferable to take the lower valence value (e.g. valence 2 in the case of Nb).

The annealing can be conducted either in an oxidizing atmosphere or in a reducing atmosphere.

In order to prevent deterioration of the thus obtained superconducting materials, it is necessary to take care of the selection of suitable stoichiometric compositional ratio of starting materials, ionic radii, and electrical neutrality.

Figure 10:
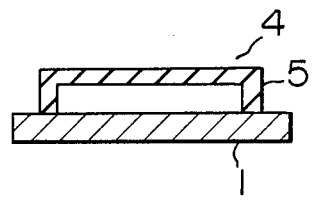
FIGS. 10 and 11 are cross-sectional views of parts according to this invention.

FIG. 10 is a cross-sectional view of one example of superconducting components according to this invention, wherein an oxygen prevention film 5 is used in order to solve the problem of being easily oxidizable. That is, the entire exposed portions (sides and upper side) of the superconducting thin film 4 formed on a substrate 1 are covered with an oxygen preventing film 5. Examples of the oxygen preventing film 5 are films of copper, synthetic resins such as polyimides, silicon nitride, and polymer films obtained by using fluorinated hydrocarbon gases as starting materials, but not limited thereto. The important thing is that the oxygen preventing film can prevent the oxidation of low-valence atoms remaining in the perovskite-like structure due to infiltration of oxygen from the outside. It is also possible to form an oxygen preventing film on a cladding material (the surface layer and the outer-side layer) in the case of wires of oxide superconducting materials of this invention.

Figure 11:
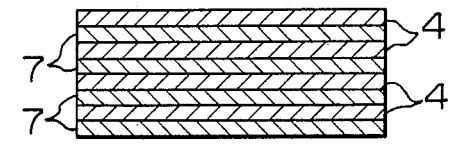

FIG. 11 is a cross-sectional view of another example of superconducting components according to this invention. In FIG. 11, insulating sheets 7 are interposed between a plurality of thin films 4 of the super-conducting materials of this invention. As the insulating sheet, it is preferable to use a material having a perovskite-like structure, since the interfaces can be improved due to having the same or similar lattice constants and crystal structures. The thickness of each sheet is preferably 10 to 20 Å. As the insulating sheet, there can be used $SrTiO_3$, $LiNbO_3$, and the like. When the superconducting material of this invention contains Nb, the use of $LiNbO_3$ is useful due to its affinity.

Production of $(L_xA_{1-x})_iMO_y$ by substitution of Cu with M element

Figure 12:
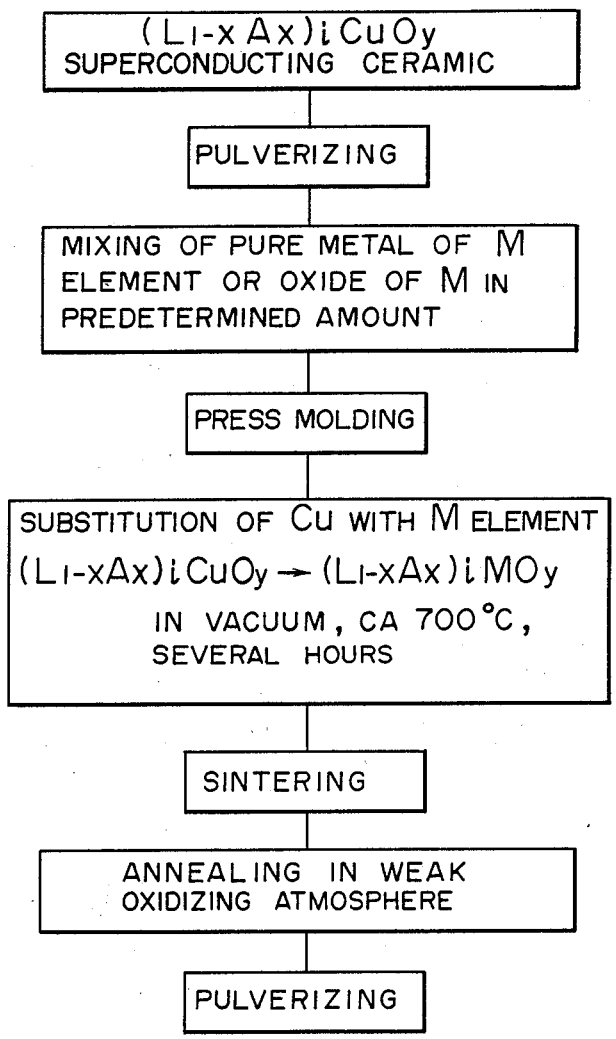
FIGS. 12, 13 and 14 show individual steps according to the processes of this invention.

The process is explained referring to FIG. 12.

An oxide containing Cu mainly and represented by the formula: $(L_xA_{1-x})CuO_y$ is synthesized first. This can be produced by weighing powders of an oxide of an L element, a carbonate of an A element and CuO in the desired stoichiometric amounts as starting materials, mixing the starting materials, reacting with mixture at about 900° C. for several hours in the air, pulverizing the reacted product, press molding the resulting powder, and sintering at 900° C. to 1100° C. for several hours in an oxidizing atmosphere such as air. By pulverizing the copper-containing oxide, there is obtained a superconducting powder. To the resulting powder, a pure metal powder of an M element is added and mixed to make Cu:M≈1:1. The resulting mixture is press molded and reacted at 700° to 1000° C. for several hours in vacuum to substitute the Cu atom with the M element, followed by sintering for several hours in a weakly oxidizing atmosphere to yield a ceramic. The resulting ceramic is annealed in an oxidizing atmosphere, followed by pulverization to yield a superconducting powder of $(L_xA_{1-x})_iMO_y$.

Production of $(L_xA_{1-x})_iMO_y$ by sputtering

Figure 13:
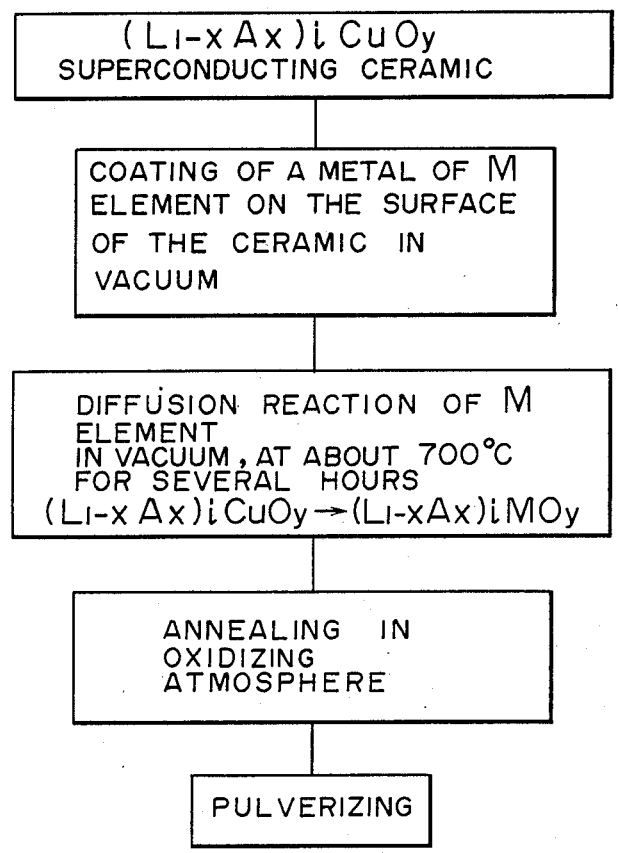

The process is explained referring to FIG. 13.

The superconducting ceramic of $(L_xA_{1-x})_iCuO_y$ is synthesized in the same manner as mentioned above. On the outer surface of the thus obtained ceramic, a film of pure metal of an M element is coated by sputtering or vapor deposition method in vacuum. The resulting product is subjected to a diffusion-substitution reaction at 700° to 900° C. in vacuum for several hours. The resulting ceramic of $(L_xA_{1-x})_iMO_y$ is stable in the air. This ceramic is annealed at 500° to 900° C. for several tens of hours in an oxidizing atmosphere. The resulting product is pulverized to give a super-conducting powder of $(L_xA_{1-x})_iMO_y$.

A superconducting body with the desired shape can be produced by press molding the resulting ceramic powder into the desired shape, sintering the molded product at 900° to 1100° C. for several hours in an oxidizing atmosphere, followed by annealing at 600° to 900° C. for several tens of hours in an oxidizing atmosphere.

Figure 14:
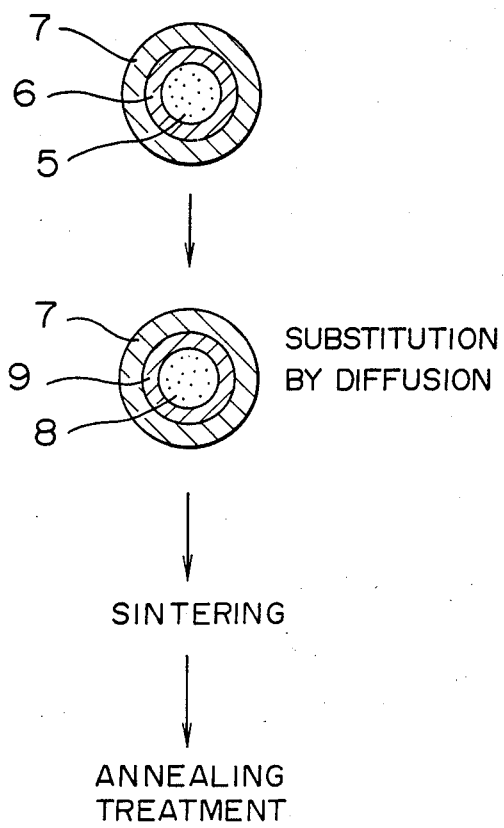

A superconducting wire can be produced by packing the above-mentioned ceramic powder in a metal tube made of Cu, Ag, etc., followed by heat treatment. Further, as shown in FIG. 14, a powder 5 of $(L_xA_{1-x})_iCuO_y$ is packed in a metal tube 6 made of an M element, which is then housed in a metal tube 7 and subjected to heat treatment at about 700° C. for several hours to carry out a substitution reaction of the Cu atom in the powder 5 with the M atom of the metal tube 6 made of an M element to give a powder 8 of $(L_xA_{1-x})_iMO_y$. The inner side of the metal tube 6 becomes a metal tube 9 having waste Cu atoms produced by the substitution reaction. By subjecting this to heat treatment, sintering and annealing can be conducted.

Figure 15:
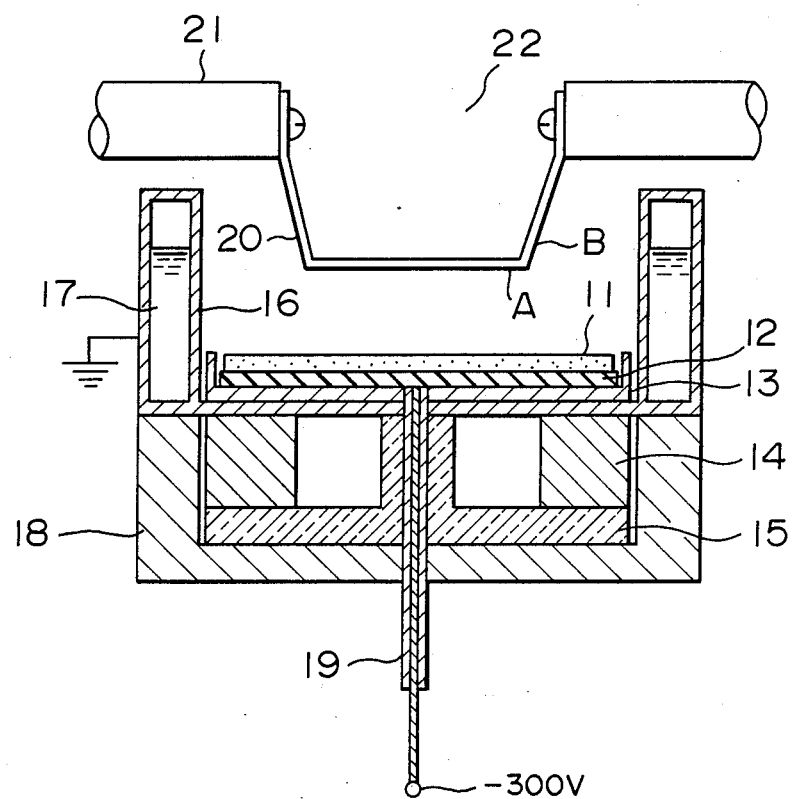
FIG. 15 is a cross-sectional view of a direct current magnetron sputtering apparatus.

An apparatus usable for the above-mentioned illustration is explained referring to FIG. 15, which is a schematic cross-sectional view of a direct current magnetron sputtering apparatus. As a target 11, there is used a sintered body of a La—Sr—Cu—O$_{4-\delta}$ oxide. This oxide can be obtained by thoroughly mixing powders of La$_2$O$_3$, SrCO$_3$ and CuO, reacting the resulting mixture at 900° C. for about 10 hours in the air with heating, press molding the reaction product powder into a circular plate, and sintering the circular plate at 1100° C. for about 5 hours. The thus obtained target is placed on a cathode plate 12 made of copper. Numeral 13 denotes an electrically insulating part, and numeral 14 denotes a permanent magnet of samarium-cobalt series which is used for conducting magnetron sputtering discharge by forming a circular magnetic field distribution on the top face of the target 11 together with a magnetic circuit part 15 having high permeability. An earthed anode 16 is also used as a container for liquid nitrogen 17 and cooled to the liquid nitrogen temperature level. The bottom plate of said container is positioned between the electrical insulating part 13, the permanent magnet 14 and the magnetic circuit part 15 and is maintained at the liquid nitrogen temperature level. Numeral 18 denotes a part for holding the permanent magnet 14, the magnetic circuit part 15 and the anode 16. Numeral 19 denotes a lead wire for applying a negative direct current voltage to the anode plate 12. A niobium thin plate 20 which becomes a substrate for forming an oxide superconducting thin film is placed on a heater electrode 21. Argon is used as a sputtering atmosphere 22 and is controlled within a pressure range of about 0.1 to 0.8 Torr during sputtering.

The production of La—Sr—Nb—O series oxide superconducting material can be carried out as follows. A sputtering chamber is evacuated to about $1 \times 10^{-6}$ Torr. Then, liquid nitrogen is charged into the anode 16. Argon gas is continuously flowed into the sputtering chamber so as to make the pressure 0.5 Torr. To the niobium thin plate 20 which becomes a substrate for forming the oxide superconducting film, an electric current is passed via the heater electrode 21 and set so as to make the temperature of the niobium thin plate 1100° to 1200° C. To the lead wire 19 connected to the anode plate 12, a negative voltage of about 300V which becomes the sputtering voltage is applied, and the magnetron sputtering discharge is started. At this stage, the sputtering current is about 250 mA. The sputtering is conducted for about 1 hour. A La—Sr—Cu—O oxide film adhered to the A and B portions of the niobium thin plate which is also used as a heater is subjected to a diffusion reaction with the niobium substrate 20 and a substitution reaction of Cu by Nb in the course of the film formation to finally form a La—Sr—Nb—O film layer of about 5 μm thick on the niobium substrate 20. After the sputtering, the temperature of the niobium substrate is lowered to about 500° C. in about 10 minutes. Then, the liquid nitrogen is removed, and oxygen is introduced into the argon atmosphere until a pressure of about 2 Torr is obtained to subject the niobium substrate surface to oxidation treatment for about 10 minutes. Subsequently, the temperature of the niobium substrate is lowered to about 100° C. in about 5 minutes. Under this state, oxygen is further introduced into the argon atmosphere to make the pressure about 100 Torr, and allowed to stand for 24 hours.

Figure 16:
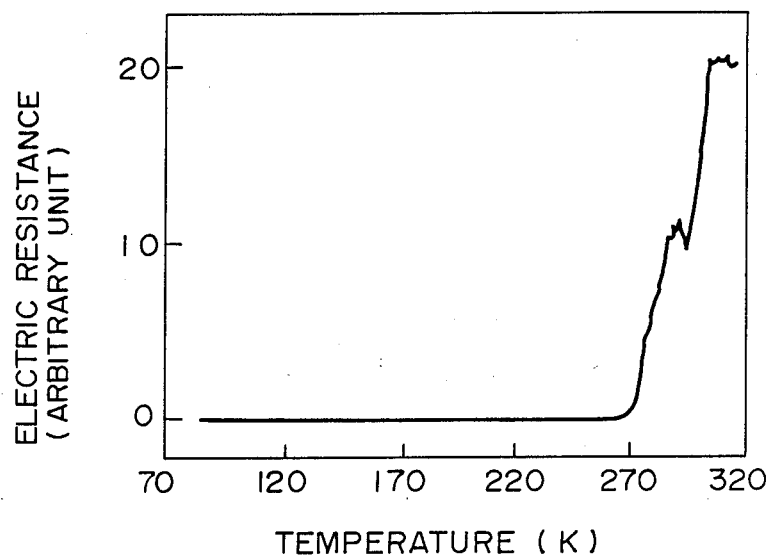
FIG. 16 is a graph showing temperature change of the electric resistance of oxide superconducting material obtained in an example of FIG. 15.
Figure 17:
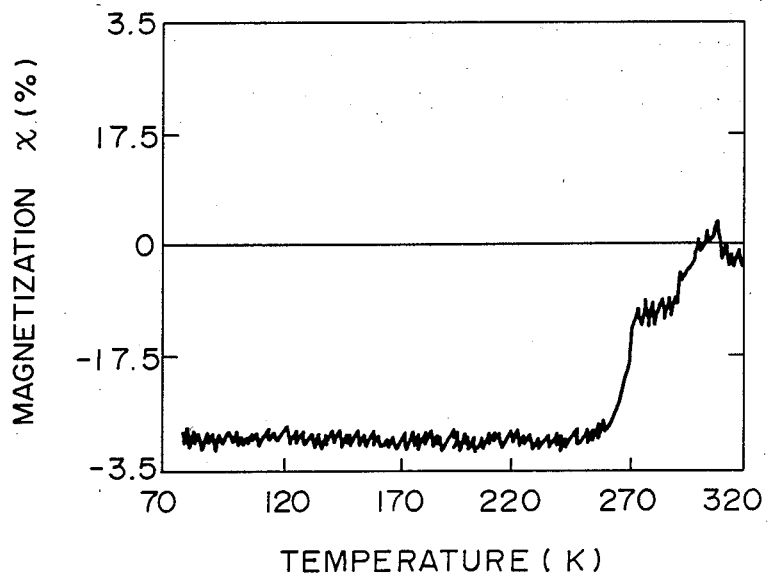
FIG. 17 is a graph showing the magnetization of the same material as used in FIG. 16.

The thus obtained niobium substrate is cut into a suitable size and subjected to the measurement of electric resistance and magnetization by varying temperatures. A sample of the A portion shown in FIG. 15 does not show a superconducting state at about 4° K. or higher. On the other hand, a sample of the B portion lowers its electric resistance rapidly at about 300° K. as shown in FIG. 16 and reaches zero electric resistance at about 270° K. Further, the magnetization of this sample is decreased to the negative side at about 300° K. corresponding to the temperature change of electric resistance, and becomes an almost constant value at about 250° K. as shown in FIG. 17. From the above-mentioned two facts, it is estimated that the sample of B portion is transferred to the superconducting state at about 270° K.

According to the above illustration, since La—Sr—Nb—O oxide superconducting material can be produced stably with good reproducibility, it is effective to produce oxide superconducting materials having a Tc of about 270° K.

Figure 18:
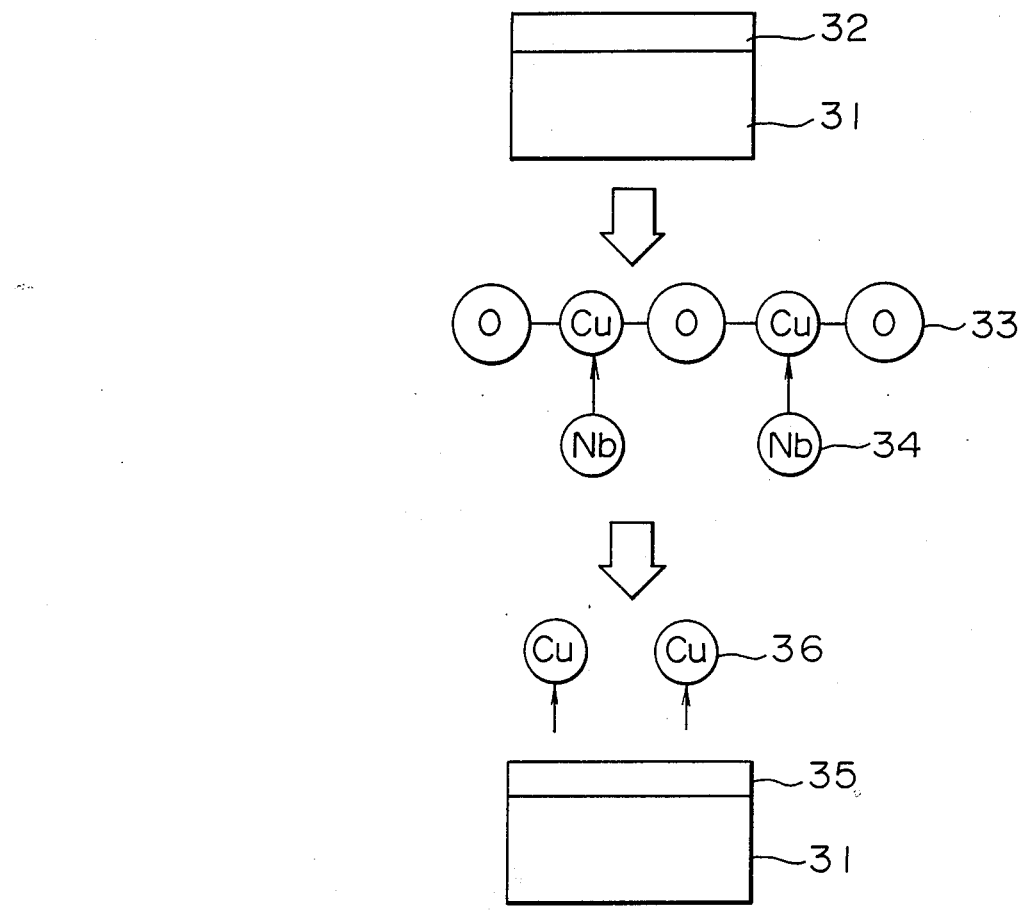
FIG. 18 shows the progress of substitution reaction according to one example of this invention.
Figure 19:
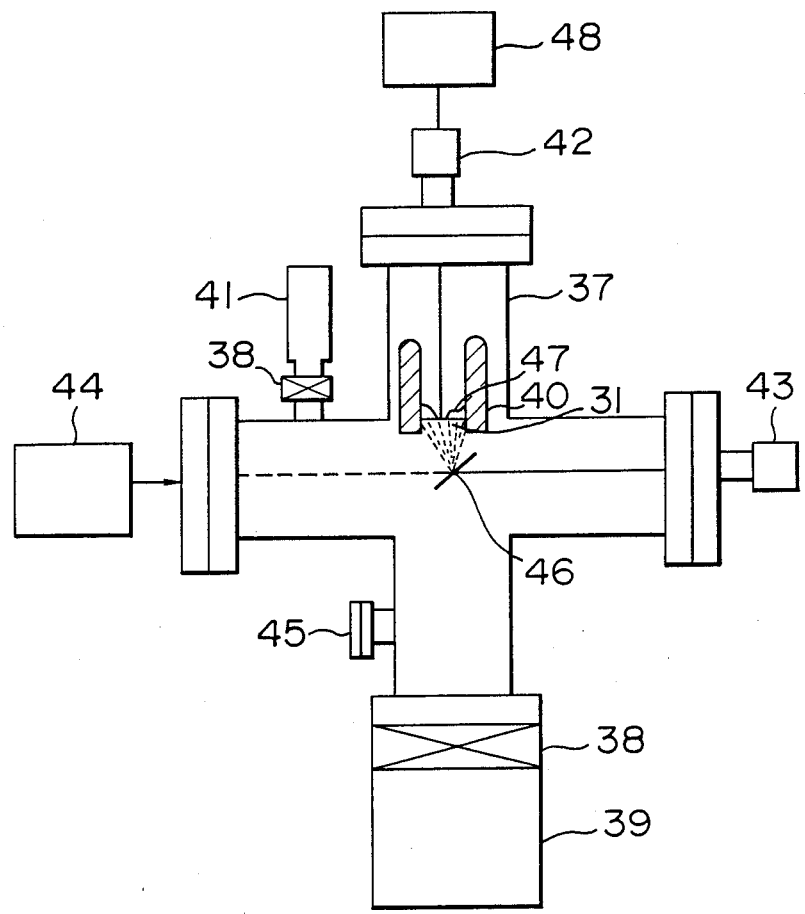
FIG. 19 is a schematic cross-sectional view of a laser using apparatus used in one example of this invention.
Figure 20:
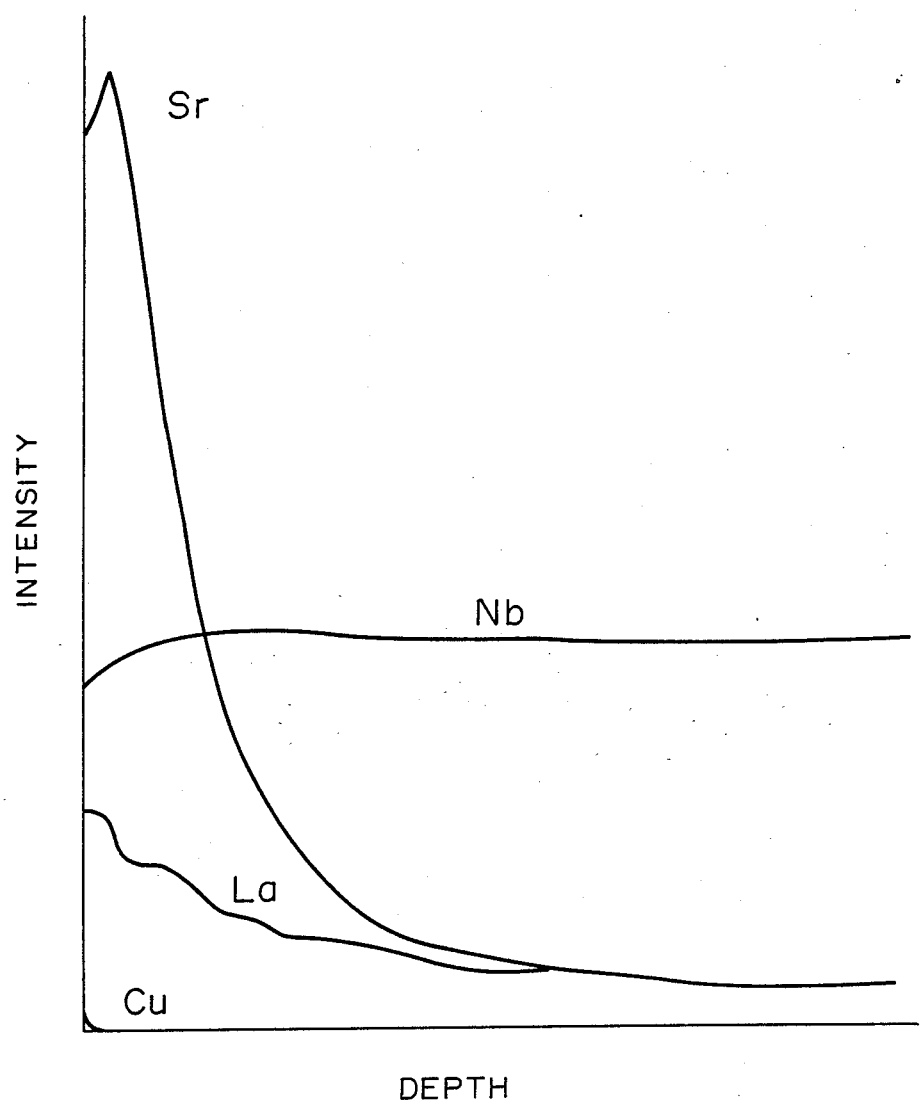
FIG. 20 is a graphs showing IMA (Ion Micro Analyzer) analysis of the thin film obtained by the apparatus of FIG. 19.

Another illustration is explained referring to FIGS. 18 to 20. FIG. 18 is a schematic flow chart showing the production of La—Sr—Cu—O series super-conducting thin film by the reaction between a substrate and a vapor deposited film. FIG. 19 is a schematic cross-sectional view showing another apparatus for producing a superconducting thin film according to this invention. FIG. 20 is a graph showing the results of analysis of element distribution in a thin film by using an ion microanalyzer.

A principle of the process of this invention is explained referring to FIG. 18. On a niobium substrate 31, a La—Sr—Cu—O film 32 is vapor deposited. Copper atoms 33 in the vapor deposited La—Sr—Cu—O film 32 are substituted with niobium atoms 34 diffused from the substrate 31. In order to rapidly bring about the substitution reaction, it is necessary to heat the niobium substrate 31 at sufficiently high temperatures and to make fast the diffusion rate of the niobium atoms 34 into the La—Sr—Cu—O film 32. As a result of the substitution reaction, a La—Sr—Nb—O film 35 is formed on the niobium substrate 31. The liberated copper atoms 36 are vaporized.

FIG. 19 is a schematic cross-sectional view of an apparatus used for producing thin films of this invention. The niobium substrate 31 shown in FIG. 18 is installed vacuum chamber 37. The vacuum chamber 37 can be maintained at ultrahigh vacuum of the order of $10^{-10}$ Torr by means of a turbo-molecular pump 39. It is also possible to introduce gases such as oxygen, argon, etc. through a gas introducing valve 45. When the pressure becomes $10^{-3}$ Torr or higher, the turbo-molecular pump 39 is separated by a gate valve 38. The niobium substrate 31 is heated by directly passing an electric current from a constant electric current source 48 through an electric current input terminal 42. A La—Sr—Cu—O target 46 for vapor deposition is fixed to a revolving, linear introducing mechanism 43, and irradiated by a pulsed Nd:YAG laser light 44 to vaporize La—Sr—Cu—O and to vapor deposit on the niobium substrate 31. On the niobium substrate 31, the substitution reaction of copper atoms with niobium atoms takes place as explained in FIG. 18 to form a La—Sr—Nb—O film on the niobium substrate 31. In order to maintain the formed crystal structure showing superconductivity at room temperature, the niobium substrate 31 is rapidly cooled immediately after stopping the electric current after completion of the vapor deposition. This rapid cooling is carried out via a copper wire mesh 47 insulated electrically from a cooling shroud 40 installed so as to surround the niobium substrate 31, the niobium substrate 31 being thermally connected to the cooling shroud 40. In order to monitor the composition of vapor deposited molecules at the time of vapor deposition, a mass filter 41 is attached via a gate valve 38.

A La—Sr—Nb—O thin film showing superconductivity at near room temperature can be produced by using the apparatus shown in FIG. 19. As the niobium substrate 31, there is used a niobium foil 5 mm wide and 50 μm thick. The niobium substrate 31 is attached to the electric current input terminal 42. The vacuum container 37 is evacuated by the turbo-molecular pump 39 to a pressure of the order of $10^{-7}$ Torr. Then, the cooling shroud 40 is filled with liquid nitrogen and the niobium substrate 31 is heated by passing an electric current from the constant electric current source 48. The temperature of the niobium substrate is maintained at 1100° C. After separating the turbo-molecular pump 39 with the gate valve 38, argon gas is introduced from the gas introducing valve 45 to make the pressure 0.5 Torr. Then, the LaSrCuO$_4$ target 46 of 100 mm in diameter and 5 mm in thickness attached to the revolving linear introducing mechanism 43 is irradiated with a Nd:YAG laser light 44 having a wavelength of 1064 nm, a maximum intensity of $10^7$ Watt/cm$^2$, a pulse width of 0.12 ms, and a repeating rate of 10 Hz. The distance between the niobium substrate 31 and the LaSrCuO$_4$ target 46 is 4 cm. The angle of incidence of the Nd:YAG laser light 44 to the target 46 is made 25°. Under such conditions, a vapor deposition rate of about 1 nm/s can be obtained. When the film thickness of the vapor deposited film becomes 2 μm, the constant electric current source 48 for heating by passing an electric current is turned off. The vapor deposited film is rapidly cooled by heat conduction via the copper wire mesh 47 to the cooling shroud 40 to the liquid nitrogen temperature within several minutes. The resulting film shows the presence of copper atoms in a very small amount and the substitution of copper atoms with niobium atoms as shown in FIG. 20. The resulting thin film shows diamagnetism in ⅓ of super-conducting niobium near room temperature.

As the vapor deposition method, a sputtering method, and electron beam vapor deposition can also be used in place of the laser light.

According to the above-mentioned illustration, La—Sr—Nb—O thin films showing superconductivity near room temperature can easily be produced stably.

As mentioned above, according to this invention, oxide superconducting materials having a Tc of 150° K. or higher can be produced easily. Thus, the liquid nitrogen temperature level for maintaining superconductivity is not necessary according to this invention.

What is claimed is:

1. A process for producing a film of oxide superconducting material represented by the formula:

$$(L_xA_{1-x})_iMO_y \quad (1) \text{ or}$$

$$(L_xA_{1-x})_iM_{l-z}Cu_zO_y \quad (2)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; i is 1, 3/2 or 2; y is $0<y\leq3$ in the case of i=1, or $0<y\leq4$ in the case of i=3/2 or 2; and z is $0<z<1$, which comprises
  depositing, on a metal film of one element selected from the group consisting of the elements L, A, and M, an oxide of the rest of the elements other than that of the metal film, and
  heat treating the metal film and the resulting deposited layer to carry out a diffusion reaction therebetween.

2. A process according to claim 1, wherein a concentration gradient of the constituting metal elements is formed by the diffusion reaction in the film in the thickness direction.

3. A process for producing a film of oxide superconducting material represented by the formula:

$$(L_xA_{1-x})_iMO_y \quad (1)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; i is 1, 3/2 or 2; and y is $0<y\leq3$ in the case of i=1, or $0<y\leq4$ in the case of i=3/2 or 2, which comprises
  using as a target an oxide represented by the formula:

$$(L_xA_{1-x})_iCuO_y \quad (4)$$

wherein L, A, x, i and y are as defined above, and as a substrate a film of the element M,
  passing an alternating electric current through the substrate so as to maintain the temperature of the substrate at 1000° to 1400° C.,
  conducting sputtering by using a direct current magnetron sputtering apparatus in an argon atmosphere with a pressure of 0.1 to 0.8 Torr at a sputtering voltage of 200 to 400V and a sputtering electric current of 20 mA to 100 mA, and
  conducting a diffusion reaction between the substrate and the sputtered layer.

4. A process according to claim 3, which further comprises subjecting the resulting film-coated substrate to heat treatment at 500° to 600° C. for 10 to 30 minutes in a weakly oxidizing atmosphere.

5. A process for producing a powder of oxide superconducting material represented by the formula:

$$(L_xA_{1-x})_iMO_y \quad (1)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; i is 1, 3/2 or 2; and y is $0<y\leq 3$ in the case of i=1, or $0<y\leq 4$ in the case of i=3/2 or 2, which comprises
depositing a film of pure metal of the element M on the outer surface of an oxide represented by the formula:

$$(L_xA_{1-x})_iCuO_y \quad (4)$$

wherein L, A, x, i and y are as defined above, in vacuum,
substituting the Cu of the oxide of the formula (4) with the element M at 600° to 900° C. by the diffusion of the element M,
subjecting the resulting product to annealing in an oxidizing atmosphere, and
pulverizing the resulting annealed product.

6. A process for producing a film of superconducting material represented by the formula:

$$(L_xA_{1-x})_iMO_y \quad (1)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; i is 1, 3/2 or 2; and y is $0<y\leq 3$ in the case of i=1, or $0<y\leq 4$ in the case of i=3/2 or 2, which comprises
using as a substrate at least one material selected from the group consisting of silicon, aluminum oxide, silicon oxide, magnesium oxide and zirconium oxide,
forming a metal thin film of the element M on the substrate,
depositing a film of $L_xA_{1-x}$, wherein L, A and x are as defined above, on the metal thin film, and
subjecting the resulting film to heat treatment to carry out a diffusion reaction of these elements.

7. A process according to claim 6, wherein a plurality of the metal thin films of the element M and a plurality of the $L_xA_{1-x}$ films are laminated alternately on the substrate before the heat treatment.

8. A process for producing a superconducting material represented by the formula:

$$(L_xA_{1-x})_iMO_y \quad (1)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; i is 1, 3/2 or 2; and y is $0<y\leq 3$ in the case of i=1, or $0<y\leq 4$ in the case of i=3/2 or 2, which comprises
depositing a film of $L_xA_{1-x}$, wherein L, A and x are as defined above, on a metal tape or a substrate of the element M, and
subjecting the resulting film to heat treatment to carry out a diffusion reaction of these elements.

9. A process according to claim 8, wherein the deposition of $L_xA_{1-x}$ film is carried out by a sputtering method or a molecular beam epitaxy method.

10. A process for producing a film of super-conducting material represented by the formula:

$$(L_xA_{1-x})_iM_{1-z}Cu_zO_y \quad (2)$$

wherein L is at least one element selected from the group consisting of Sc, Y, lanthanide elements of atomic numbers 57 to 71, and Li, Na, K, Rb, Cs and Fr belonging to the group Ia of the periodic table; A is at least one element selected from alkaline earth metal elements; M is at least one element selected from the group consisting of V, Nb, Ta, Ti, Zr and Hf; x is $0<x<1$; z is $0<z<1$; i is 1, 3/2 or 2; y is $0<y\leq 3$ in the case of i=1, or $0<y\leq 4$ in the case of i=3/2 or 2, which comprises
using a substrate made of at least one member selected from the group consisting of silicon, aluminum oxide, silicon oxide, magnesium oxide, and zirconium oxide,
forming a metal thin film of the element M on the substrate,
depositing an amorphous or polycrystalline film of $(L_xA_{1-x})_iCuO_y$ on the metal thin film, and
subjecting the resulting film to heat treatment to diffuse the element M into the $(L_xA_{1-x})_1CuO_y$ film.

11. A process for producing a film of La—Sr—Nb—O oxide super conducting material which comprises
using as a target a La—Sr—cu—O$_4$ sintered body, and as a substrate a niobium material,
passing an alternating electric current through the substrate so as to maintain the temperature of the substrate at 1000° to 1400° C.,
conducting sputtering in an argon atmosphere with a pressure of 0.1 to 0.8 Torr at a sputtering voltage of 200 to 400V and a sputtering electric current of 20 mA to 100 mA to form a film of La—Sr—Cu—O$_4$ on the niobium substrate surface,
conducting a diffusion reaction between the substrate and the sputtered layer, and
subjecting the resulting niobium substrate to heat treatment at 500°–600° C. for 10–30 minutes in a weakly oxidizing atmosphere.

* * * * *